(12) United States Patent
Karhade et al.

(10) Patent No.: US 12,500,132 B2
(45) Date of Patent: Dec. 16, 2025

(54) FORMATION OF A RECONSTITUTED CIRCUIT DEVICE USING FLOW OF A MATERIAL BY CAPILLARY ACTION

(71) Applicant: Intel Corporation, Santa Clara, CA (US)

(72) Inventors: Omkar Karhade, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 848 days.

(21) Appl. No.: 17/558,294

(22) Filed: Dec. 21, 2021

(65) Prior Publication Data

US 2023/0197551 A1    Jun. 22, 2023

(51) Int. Cl.
*H01L 23/31* (2006.01)
*H01L 21/56* (2006.01)
*H01L 23/00* (2006.01)
*H01L 23/29* (2006.01)
*H01L 25/065* (2023.01)

(52) U.S. Cl.
CPC ........ *H01L 23/3178* (2013.01); *H01L 21/561* (2013.01); *H01L 23/293* (2013.01); *H01L 24/08* (2013.01); *H01L 25/0652* (2013.01); *H01L 25/0655* (2013.01); *H01L 2224/08145* (2013.01)

(58) Field of Classification Search
CPC ....... H01L 2224/08145; H01L 23/3178; H01L 25/0652; H01L 25/0655; H01L 25/105; H01L 21/561; H01L 23/293; H01L 2225/06548

USPC .......................................................... 257/622
See application file for complete search history.

(56) References Cited

U.S. PATENT DOCUMENTS

| | | | |
|---|---|---|---|
| 8,535,989 B2 | 9/2013 | Sankman et al. | |
| 8,716,859 B2 | 5/2014 | Meyer et al. | |
| 10,943,851 B1 | 3/2021 | Elsherbini et al. | |
| 12,033,973 B2* | 7/2024 | Nam ................... | H01L 23/3135 |
| 2009/0166843 A1 | 7/2009 | Kutter et al. | |
| 2019/0393131 A1* | 12/2019 | Eid ........................ | H01L 23/473 |
| 2020/0105639 A1* | 4/2020 | Valavala ................ | H10N 10/17 |
| 2020/0321314 A1* | 10/2020 | Liu ......................... | H01L 24/06 |

* cited by examiner

*Primary Examiner* — Didarul A Mazumder
(74) *Attorney, Agent, or Firm* — Essential Patents Group, LLP

(57) ABSTRACT

Techniques and mechanisms for a reconstituted circuit device to be formed using a flow of material, by capillary action, in a region between a first die and a second die. In an embodiment, a rigid mass extends around, and between, the first die and the second die. The rigid mass comprises a first body of a first material, and a second body of second material, wherein the bodies each extend across the region to respective sidewall structures of the first and second dies. In the region, a portion of the first body forms a surface structure which adjoins the second body. A concave or convex shape of the surface structure is an artefact of a meniscus formed by the first material during a liquid state thereof. In another embodiment, the reconstituted circuit device further comprises an interconnect which adjoins, and extends through, the rigid mass.

14 Claims, 11 Drawing Sheets

FORMATION OF A RECONSTITUTED CIRCUIT DEVICE USING FLOW OF A MATERIAL BY CAPILLARY ACTION

BACKGROUND

1. Technical Field

Embodiments of the invention relate generally to packaged devices and more particularly, but not exclusively, to a reconstitution of multiple integrated circuit dies into a single device.

2. Background Art

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As these goals are achieved, the integrated circuit devices become smaller. However, computing demands have been increasing considerably faster than scaling (e.g., Moore's law) can achieve. For example, machine intelligence systems are requiring core counts in the thousands, "near compute" memory of greater than 10 gigabytes, connectivity bandwidth of greater than one terabyte per second between multiple nodes, low latency, thermal control, and good manufacturability, as will be understood to those skilled in the art. Attempts have been made to meet these requirements through monolithic integration and/or wafer stacking.

Monolithic integration typically includes forming a wafer scale supercomputer, which employs several levels of redundancy, such that a large area of monolithically integrated silicon (e.g., a wafer) is functional. However, such monolithic integration tends to have drawbacks, including lower performance due to parasitic capacitance, greater design complexity, and significant area penalty to support the integration, as will be understood to those skilled in the art. Wafer stacking is used in conjunction with monolithic integration to assist with heterogeneity, such as between memory and computing devices, but does not address the other issues with regard to monolithic integration, as previously mentioned.

Assembly-based approaches are used to form a reconstituted wafer for the monolithic integration, wherein a plurality of "known good dice", i.e., integrated circuit devices, are attached together, such as with a dielectric material, to form a wafer-like substrate. Typically, the integrated circuit devices are electrically coupled by "die-stitching" structures, such as embedded multi-die interconnect bridges (EMIBs), passive interposers, advanced high-density organic packages, and the like. Although reconstituted wafers can address some of the previously mentioned issues with regard to monolithic integration, additional innovations are needed to overcome existing challenges with regard to latency, bandwidth density, and thermal control. As the demands placed on semiconductor technologies continue to grow, there is expected to be an increasing premium placed on improvements to how integrated circuit dies are assembled or otherwise made available for packaging.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
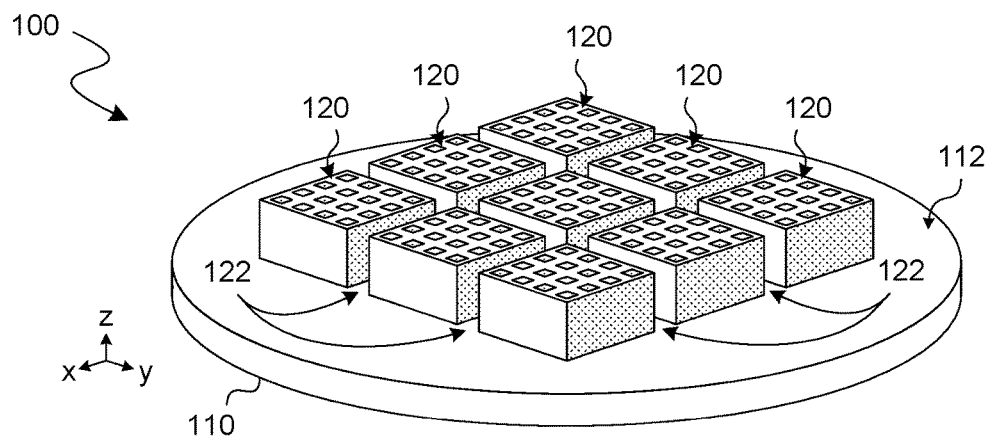
FIGS. 1A through 1C show perspective view diagrams each illustrating respective stages of a process to provide a reconstituted wafer according to an embodiment.

Embodiments discussed herein variously provide techniques and mechanisms for a reconstituted circuit device to be formed using a flow of material by capillary action between two integrated circuit (IC) dies. The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including multiple IC dies and a rigid mass which is adjoins and (for example, extends between) two such IC dies.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Certain features of various embodiments are described herein with reference to a reconstituted circuit device comprising multiple IC dies which each include, inter alia, respective active circuit components (e.g., in an active layer of a given IC die), and respective back end of line structures to facilitate communication with and/or other operation of said active circuit components. However, in some embodiments, one or more IC dies of such a reconstituted circuit device each omit active circuit components and/or back end of line structures. For example, in one such embodiment, a reconstituted circuit device comprises a die of bare silicon or other suitable material—e.g., wherein such a die is bonded to an adjoining die by an epoxy resin or other suitable adhesive material. Such a die (sometimes referred to as a "dummy die") is provided, for example, to improve thermal expansion characteristics of the reconstituted circuit device.

Figure 1B:
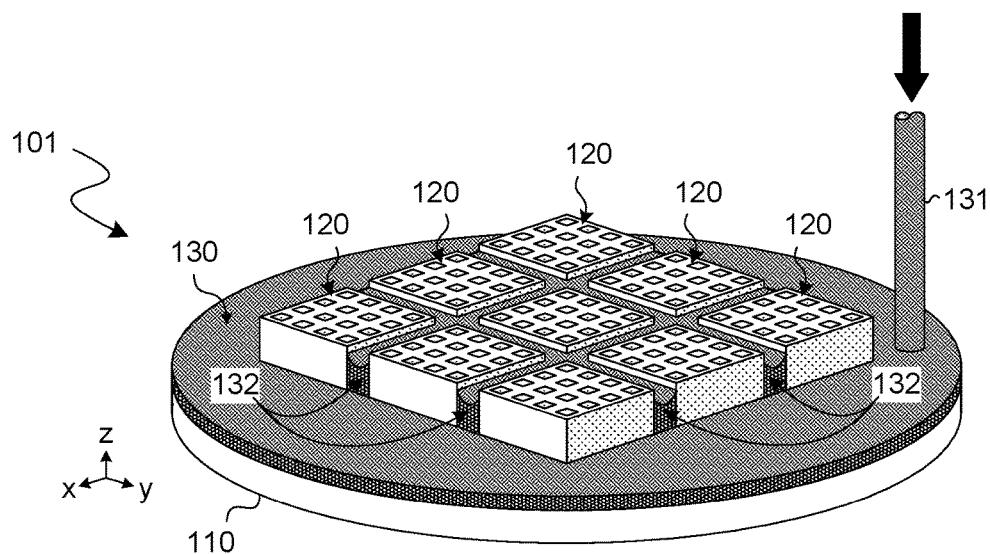
Figure 1C:
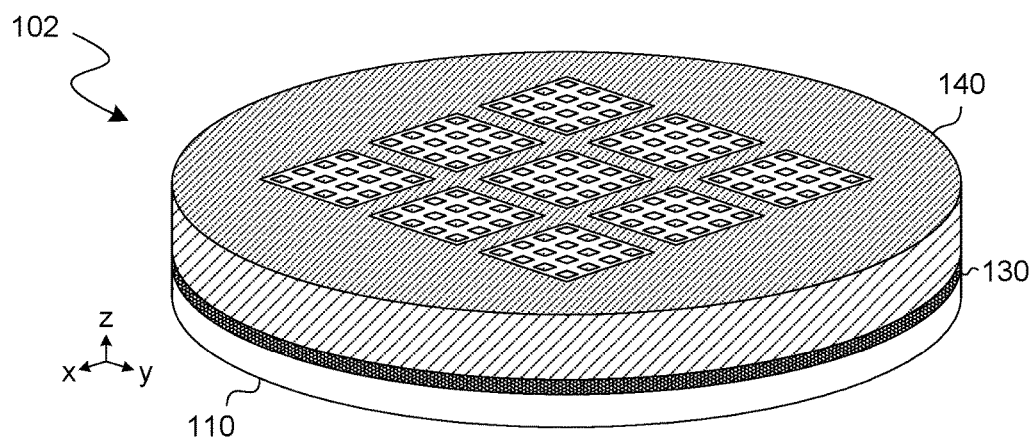

FIGS. 1A through 1C show respective devices 100, 101, 102 each at a corresponding stage of a process to provide a reconstituted circuit device according to an embodiment. The processing illustrated by devices 100, 101, 102 is one example of an embodiment which provides a rigid mass which extends between various ones of multiple integrated circuit (IC) dies. In an embodiment, such a rigid mass is formed in part by a flow of a material by capillary action into a region between two such IC dies.

As shown in FIG. 1A, device 100 comprises a carrier wafer 110 which is to provide a temporary mounting substrate for a plurality of integrated circuit (IC) dies. For example, device 100 further comprises multiple IC dies 120 which are adhered or otherwise coupled—e.g., via an adhesive layer (not shown)—to carrier wafer 110. In various embodiments, dies 120 are identical or otherwise similar—e.g., wherein two or more dies are each provide processor functionality, each provide memory functionality, or the like. Alternatively, some or all of dies 120 are dissimilar dies which (for example) are to variously provide different respective ones of a processor functionality, a memory functionality, and/or the like.

In the illustrative embodiment shown, respective surfaces (referred to herein as "back side surfaces") of IC dies 120 are each in an upward facing orientation, wherein other respective surfaces (referred to herein as "front side surfaces") of IC dies 120 are each in a downward facing orientation. By way of illustration and not limitation, respective back end of line (BEOL) structures of dies 120 variously comprise, or are coupled to, conductive contacts which are variously formed in or on the upward facing, back side surfaces of dies 120.

To promote efficiency of reconstitution processing (to form a reconstituted wafer and/or other reconstituted circuit device), some embodiments provide a flow of a first material—e.g., comprising an organic polymer—which is drawn, by capillary action, to extend vertically along the respective opposing sides of two dies. In an embodiment, the first material extends only partially along the vertical height of a given die—e.g., wherein a second material (such as an inorganic compound) is then formed on the first material to complete a formation of a rigid mass.

For example, FIG. 1B shows a view of a device 101 which is a result of further processing of the device 100 in FIG. 1A according to an embodiment. More particularly, device 101 is a result of the formation of a body 130 of a first material on carrier wafer 110—e.g., wherein body 130 extends into various regions 122 each between a respective two of IC dies 120. For example, the first material is deposited through one or more locations—for example, via the illustrative inlet 131 shown—which are offset horizontally (in the x-y plane) from some or all of regions 122. In one such embodiment, body 130 comprises an epoxy resin (and, in some embodiments, filler particles comprising silica and/or any of various other suitable compounds).

Due to capillary action, portions 132 of the first material are variously drawn into regions 122 and/or vertically upward in regions 122. After a curing of the first material, some or all of portions 132 form surface structures which each have a respective shape (e.g., one of a convex shape or a concave shape) which is an artefact of the capillary action. As compared to conventional reconstitution techniques, some embodiments variously avail of such capillary action to provide faster and/or more complete penetration of a fluid between various IC dies. In turn, this improved fluid penetration contributes to a more efficient and/or reliable formation of a rigid mass which is to extend around and between, and is to provide structural support for, said IC dies.

FIG. 1C shows a view of a device 102 which is a result of further processing of device 101 depicted in FIG. 1B according to an embodiment. Device 102 has been processed such that a rigid mass has been formed to embed IC dies 120—e.g., wherein the rigid mass has been subjected to grinding, polishing and/or other subtractive processing to expose conductive contacts which are variously formed in or on the respective back side surfaces of IC dies 120. In the example embodiment shown, the rigid mass comprises body 130 of the first material, and another body 140 of a second material which is deposited or otherwise formed on body 130. In some embodiments, the second material of body 140 comprises any of various inorganic, dielectric compounds which (for example) include one or more oxides and/or one or more nitrides. In one such embodiment, the second material comprises any of various silicon oxide compounds—such as $SiO_2$, a silicate compound, a siloxane compound, or the like—and/or any of various silicon nitride compounds (including any of various combinations and/or derivatives thereof).

Figure 2:
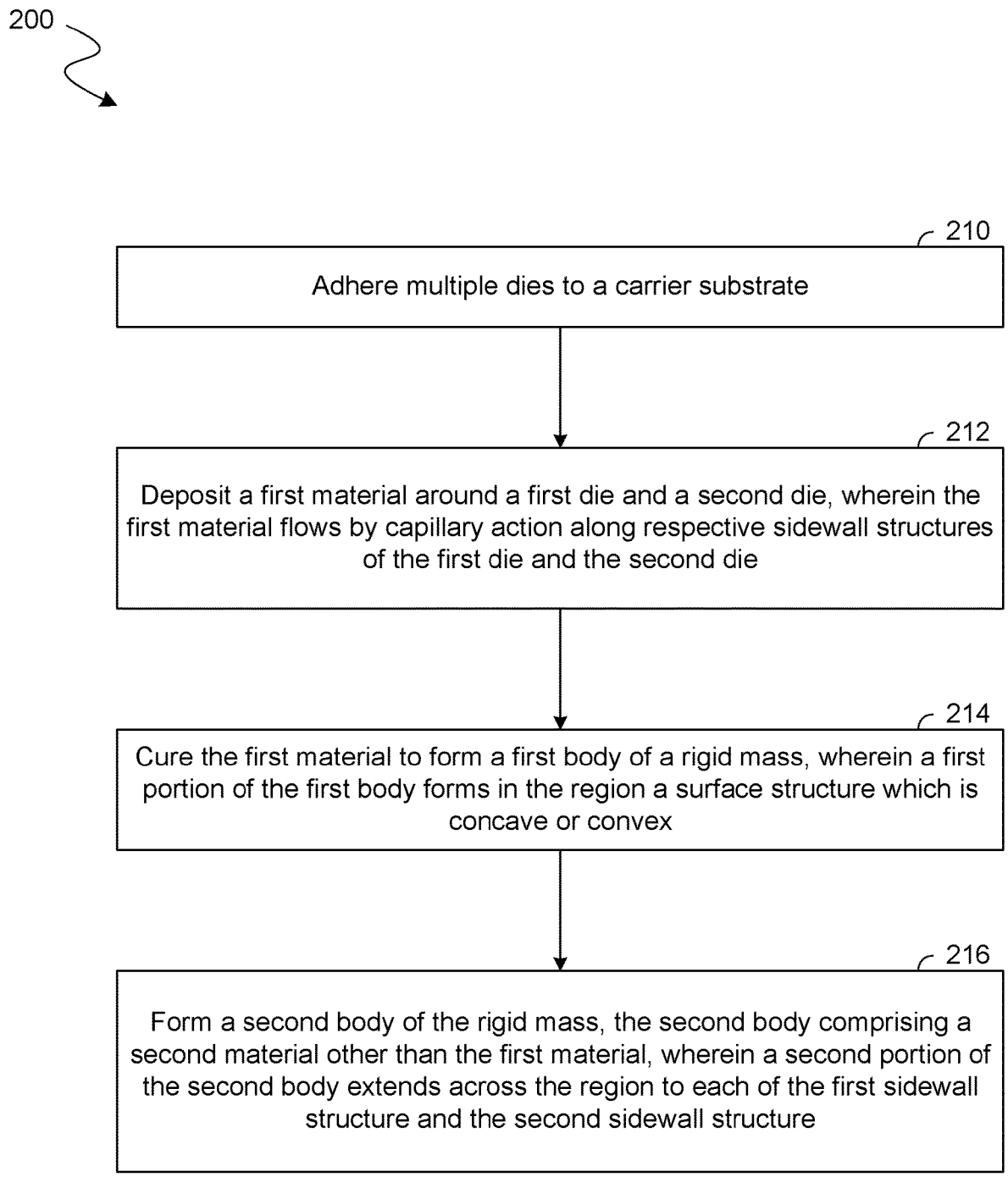
FIG. 2 shows a flow diagram illustrating features of a method to form a reconstituted circuit device according to an embodiment.

FIG. 2 shows features of a method 200 to form a reconstituted circuit device according to an embodiment. Method 200 illustrates one example of an embodiment wherein a material is flowed by capillary action between two dies (e.g., including an IC die) to form part of a rigid mass. Operations such as those of method 200 are performed, for example, to provide structures of device 102.

As shown in FIG. 2, method 200 comprises (at 210) adhering to a carrier substrate multiple integrated circuit (IC) dies comprising a first die and a second die. For example, the adhering at 210 comprises arranging dies 120 on surface 112 of carrier wafer 110. In an embodiment, the first die and the second die form a first sidewall structure and an opposing second sidewall structure (respectively)—e.g., wherein the first and second sidewall structures are separated from each other by a region between the first and second dies.

In an embodiment, method 200 further comprises operations to form a rigid mass which is to extend around the first die and the second die. For example, method 200 further comprises (at 212) depositing a first material around the first die and the second die. In the region between the first die and the second die, the first material flows by capillary action along the first sidewall structure and the second sidewall structure. For example, the first material is drawn vertically along respective portions of the first and second sidewalls structures—e.g., wherein at least some of the first and second sidewalls structures remain exposed after the deposition of the first material. In various embodiments, the first material comprises an organic polymer, such as any of various epoxy resins. In one such embodiment, the first material further comprises filler particles which (for example) contribute to a greater modulus of elasticity of the first material, and/or contribute to a less coefficient of thermal expansion of the first material.

Method 200 further comprises (at 214) curing the first material—e.g., with heat, ultraviolet light, or the like—to form a first body of a rigid mass. In one example embodiment, body 130 is formed based on the depositing at 212 and the curing at 214. After the curing at 214, a first portion of the first body forms, in the region between the first and second dies, a surface structure which is concave or convex. Such a concave or convex surface structure is an artefact of a meniscus which was formed by the first material while in its fluid state (before the curing at 214).

Method 200 further comprises (at 216) forming on the first body a second body of the rigid mass, wherein the second body comprises a second material other than the first material. By way of illustration and not limitation, the second material comprises an inorganic compound—e.g., including an oxide compound (such as $SiO_2$), or a nitride compound (such as $Si_3N_4$). In some embodiments, the forming at 216 comprises depositing a spin on glass material over the first body, and over the multiple dies, using a spin coating process. In an embodiment, a second portion of the second body extends, across the region between the first and second dies, to each of the first sidewall structure and the second sidewall structure. Furthermore, the second portion adjoins the surface structure of the first body in said region. In one example embodiment, body 140 is fabricated based on the forming at 216.

Although some embodiments are not limited in this regard, the first body and the second body each adjoin different respective portions of the first sidewall structure, and different respective portions of the second sidewall structure. By way of illustration and not limitation, in some embodiments, the first body extends vertically along the first sidewall structure to a height of active layer of the first die (and/or to a height of active layer of the second die). In one such embodiment, the first body further extends vertically to adjoin at least some portion of the first sidewall structure which is formed by a first back end of line (BEOL) of the first die (and/or to adjoin at least some portion of the second sidewall structure which is formed by a second BEOL of the second die). In one illustrative embodiment, a thickness of that portion of the second body which is within the region between the first and second dies is equal to or less than 20 microns (µm), for example.

In various embodiments, method 200 additionally or alternatively comprises one or more operations (not shown) to provide a reconstituted circuit device as part of a packaged device, and/or to couple such a reconstituted circuit device to one or more other circuit structures. For example, such one or more other operations comprise performing a dicing operation to separate the first die, the second die, and a portion of the rigid mass from one or more others of multiple dies and from another portion of the rigid mass. For example, such dicing variously forms multiple reconstituted circuit devices from a monolithic reconstituted wafer. In some embodiments, a given one of such multiple reconstituted circuit devices is subsequently hybrid bonded or otherwise coupled to one or more other dies (e.g., those of another reconstituted circuit device), and/or to an interposer, a package substrate, a printed circuit board, or the like.

FIGS. 3A through 3F show respective devices 300*a* through 300*f* each at a different respective stage of a process to form a reconstituted circuit device according to an embodiment. For example, processing such as that illustrated by devices 300*a* though 300*f* is to provide some or all structures of those of device 102—e.g., wherein such processing includes one or more operations of method 200.

Figure 3A:
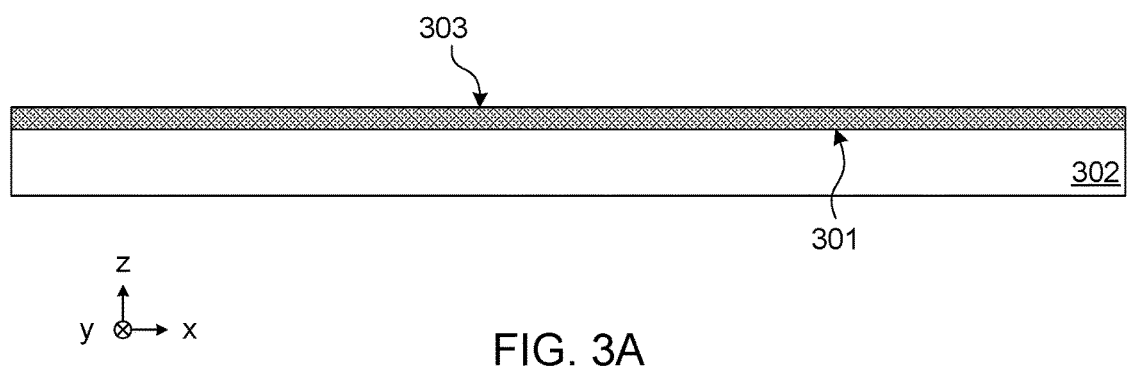
FIGS. 3A through 3F show cross-sectional side views diagrams each illustrating respective stages of a process to form a reconstituted circuit device according to an embodiment.

FIG. 3A shows a cross-sectional side view of a device 300*a* to facilitate the provisioning of a reconstituted wafer according to an example embodiment. Device 300*a* comprises a carrier wafer 302 and an adhesive layer 301 disposed thereupon. Carrier wafer 302 and adhesive layer 301 provide a temporary mounting substrate for a plurality of integrated circuit (IC) dies. In some embodiments, carrier wafer 302 is made of a ceramic material. In an embodiment, carrier wafer 302 is made of a glass material. In other embodiments, carrier wafer 302 is made of a quartz material. Adhesive layer 301 comprises any of various adhesive materials which (for example) are adapted from conventional techniques for temporarily securing dies to a handling layer or other suitable structure. Adhesive layer 301 is formulated, for example, to have an ultraviolet release action. Additionally or alternatively, adhesive layer 301 is formulated to have a thermal release action.

Figure 3B:
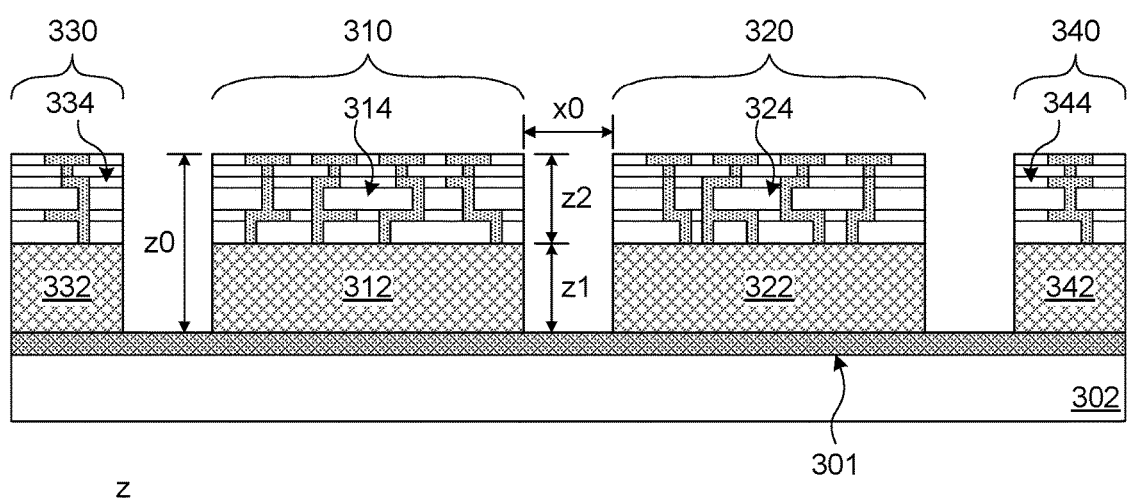

FIG. 3B shows a cross-sectional side view of a device 300*b* which is a result of further processing of device 300*a* in FIG. 3A, according to an embodiment. In the example embodiment shown, multiple IC dies (for example, comprising the illustrative IC dies 310, 320, 330, 340 shown) are adhered—via a surface 303 of adhesive layer 301—to carrier wafer 302. In one such embodiment, IC dies 310, 320, 330, 340 correspond functionally to IC dies 120—e.g., wherein carrier wafer 302 provides functionality of carrier wafer 110.

In the illustrative embodiment shown, respective surfaces (referred to herein as "back side surfaces") of IC dies 310, 320, 330, 340 are each in an upward facing orientation, wherein other respective surfaces (referred to herein as "front side surfaces") of IC dies 310, 320, 330, 340 are each in a downward facing orientation. By way of illustration and not limitation, IC die 310 comprises active circuit structures 312 which, for example, are positioned under back end of line (BEOL) structures 314 due to an orientation of IC die 310. Active circuit structures 312 comprise an active layer—e.g., a semiconductor substrate layer having formed therein or thereon any of various transistors and/or other circuit elements. In various embodiments, active circuit structures 312 further comprises front end of line (FEOL) structures including interconnect structures which variously provide electrical connectivity between the active layer and a first front side surface of IC die 310. For example, active circuit structures 312 comprise through silicon vias (TSVs) and/or other suitable interconnect structures, in some embodiments.

BEOL structures 314 comprise other interconnect structures which variously provide electrical connectivity between active circuit structures 312 and a first back side surface of IC die 310. For example, BEOL structures 314 include an alternating arrangement of dielectric layers and patterned metallization layers which are electrically coupled to each other through said dielectric layers. In various embodiments, the BEOL structures 314 of IC die 310 comprise or are otherwise coupled to first conductive contacts which are variously at (and/or extend from) the first back side surface—e.g., wherein the first conductive contacts are formed with pads, microbumps, copper posts and/or the like. By way of illustration and not limitation, the first conductive contacts of IC die 310 are raised above the first back side surface of IC die 310 in a range from zero (flush therewith) to 100 µm. In one such embodiment, the first conductive contacts of IC die 310 are raised above the first back side surface in a range from 0.5 µm to 40 µm.

Similarly, IC die 320 comprises BEOL structures 324 which form, or are otherwise proximate to, a second back side surface of IC die 320. BEOL structures 324 (for example) are positioned over active circuit structures 322 which form, or are otherwise proximate to, a second front side surface of IC die 320. Furthermore, IC die 330 comprises BEOL structures 334 and active circuit structures 332 which are positioned under BEOL structures 334—e.g., wherein IC die 340 comprises BEOL structures 344 and active circuit structures 342 which are positioned under BEOL structures 344. In an embodiment, BEOL structures 334 and active circuit structures 332 are proximate to a third back side and a third front side (respectively) of IC die 330—e.g., wherein BEOL structures 344 and active circuit structures 342 are proximate to a fourth back side and a fourth front side (respectively) of IC die 340.

In an embodiment, BEOL structures 324 form second conductive contacts at the second back side of IC die 320—e.g., wherein BEOL structures 334 form third conductive contacts at the third back side of IC die 330, and/or BEOL structures 334 form fourth conductive contacts at the fourth back side of IC die 340. The various conductive contacts of dies 310, 320, 330, 340 are formed, for example, by copper plating and/or any of various other suitable metallization processes.

In some embodiments, some or all of dies 310, 320, 330, 340 are identical or otherwise similar—e.g., wherein dies 310, 320 together provide functionality of a double-core processor device. In other embodiments, some or all of dies 310, 320, 330, 340 are dissimilar dies including (for example) a processor die, a memory die, and/or the like. In some embodiments, integrated circuitry of IC dies 310, 320, 330, 340 has a geometry which is equal to or smaller than 15 nanometer (nm) silicon technologies, for example. In some embodiments, device 300b includes more, fewer and/or differently arranged IC dies—e.g., wherein device 300b alternatively omits one or both or IC dies 330, 340. Furthermore, the particular number, size and/or arrangement of interconnect structures and/or active circuit elements in a given IC die—or the particular functionality to be provided by operation of said IC die—is not limiting on some embodiments.

Carrier wafer 302 is of sufficient rigidity that IC dies 310, 320, 330, 340 remain in place with sufficient lateral x-y (the y-direction is orthogonal to the plane of FIG. 3B) positional accuracy to allow for retention of an original placement upon adhesive layer 301. Consequently, during further processing, the lateral x-y positional accuracy of dies 310, 320, 330, 340 relative to each other is preserved. By way of illustration and not limitation, where IC die 310 and IC die 320 have identical function—e.g., where each is a respective processor die of about 8 mm by 4 mm (e.g., 7.94 mm by 3.27 mm) in size—a sufficient x-y positional accuracy is maintained for the respective conductive contacts of IC dies 310, 320, 330, 340 to enable a reconstitution process which incorporates multiple dies into a single device which further comprises a rigid mass that variously adjoins and extends between the IC dies.

To promote efficiency of such reconstitution processing, some embodiments provide a flow of a first material (e.g., comprising an organic polymer) which is drawn, to flow vertically along the respective opposing sides of two dies. In an embodiment, the first material extends only partially along the vertical height of a given die—e.g., wherein a second material (such as an inorganic compound) is then formed on the first material to complete a formation of the rigid mass.

For example, in the illustrative embodiment shown, the portion of IC die 310 which is illustrated as active circuit structures 312 has a thickness z0—e.g., wherein an upper side of active circuit structures 312 (e.g., the upward facing side of an active layer of IC die 310) is offset vertically from an upper side of adhesive layer 301 by the thickness z1. In one such embodiment, the thickness z1 is in a range of 10 µm to 750 µm (for example). Furthermore, BEOL structures 314 have a thickness z2 which, for example, is in a range of 2 µm to 30 µm—e.g., wherein an overall thickness z0 of IC die 310 is in a range of 12 µm to 780 µm. In one such embodiment, a given two dies of device 300b—e.g., including dies 310, 320—are offset horizontally from each other (in the x-y plane) at a distance x0 which promotes capillary flow of the first material. By way of illustration and not limitation, distance x0 is in a range of 50 µm to 1 mm.

Figure 3C:
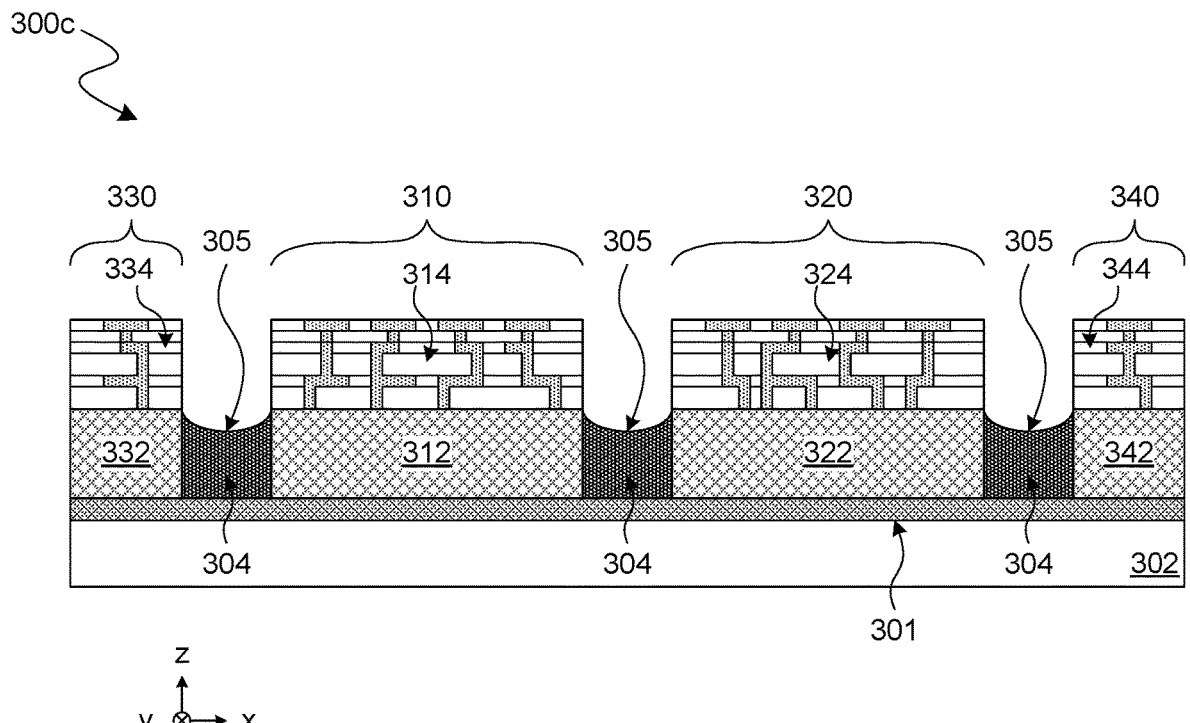

For example, FIG. 3C shows a cross-sectional side view of a device 300c which is a result of further processing of device 300b in FIG. 3B according to an embodiment. More particularly, device 300c is a result of the formation of a body 304 of a first material on adhesive layer 301 and carrier wafer 302—e.g., wherein body 304 extends into various regions each between a respective two of IC dies 310, 320, 30, 340. In one such embodiment, body 304 comprises an organic polymer—e.g., wherein body 304 corresponds to body 130.

In various embodiments, one or more portions of body 304 each form a respective surface structure, the shape of which is an artefact of a material flow by capillary action. By way of illustration and not limitation, a surface 305 of body 304 forms a first concave structure between IC dies 310, 320. Additionally or alternatively, surface 305 forms a second concave structure between IC dies 310, 330, and/or forms a third concave structure between IC dies 320, 340. Some or all such concave structures of surface 305 each result, for example, from a respective meniscus which the first material (e.g., a dielectric) forms due to capillary action while in a liquid, flowable state. A subsequent curing process (for example) transitions the first material to a solid state, thereby forming the rigid concave structures of surface 305.

In various embodiments, body 304 adjoins some or all of dies 310, 320, 330, 340, wherein body 304 extends only partially along a sidewall of a given IC die. In one such embodiment, a vertical extent of a portion of body 304—for example, the portion between dies 310, 320—is less than the overall thickness z0 of IC die 310 and/or is less than an overall thickness of IC die 320. By way of illustration and not limitation, the vertical extent of said portion is at least 25% of the overall thickness z0 of die 310—e.g., at least 50% of the thickness z0—where, nevertheless, one or more layers of BEOL structures 314 form respective sidewall portions which do not adjoin body 304. In one such embodiment, surface 305 extends to a side portion of active circuit structures 312 and/or a side portion of active circuit structures 322. In another embodiment, surface 305 extends to a side portion of BEOL structures 314 which is below the first back side surface of IC die 310 (e.g., wherein surface 305 further extends to a side portion of BEOL structures 324 which is below the second back side surface of IC die 320

Figure 3D:
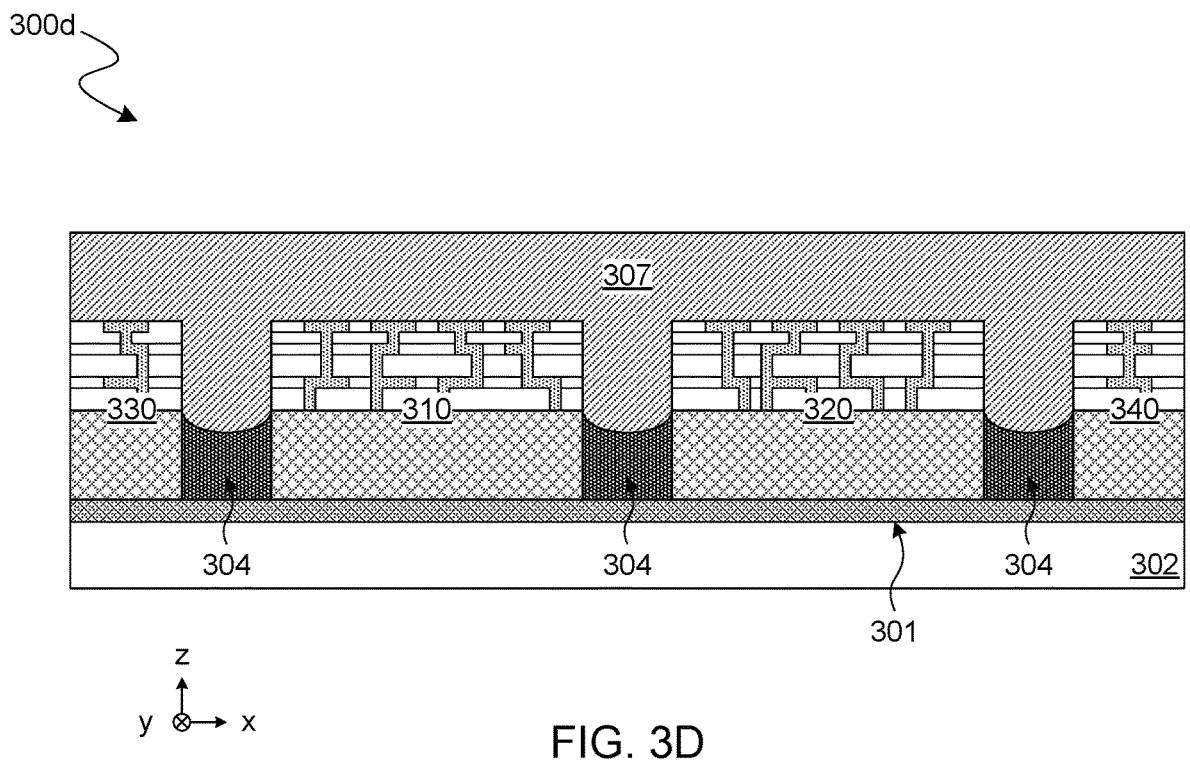

FIG. 3D shows a cross-sectional side view of a device 300d which is a result of further processing of device 300c depicted in FIG. 3C according to an embodiment. Device 300d has been processed such that a rigid mass has been formed to embed IC dies 310, 320, 330, 340—e.g., wherein the rigid mass obscures the conductive contacts which are variously formed in or on the respective back side surfaces of IC dies 310, 320, 330, 340. In the example embodiment shown, the rigid mass comprises body 304 of the first material, and another body 307 of a second material which is deposited or otherwise formed on body 304. Consequent to forming the rigid mass comprising body 304 and body 307, the dies 310, 320, 330, 340 are entirely encapsulated therewithin. At the time of deposition on IC dies 310, 320, 330, 340, the second material has (for example) relatively high viscosity, as compared to that of the first material when it is in its liquid state.

In various embodiments, the first material of body 304 comprises any of various organic compounds which (for example) are adapted from any of various materials used as an underfill in some existing packaging techniques. In one such embodiment, the first material comprises an organic polymer including, but are not limited, any of various epoxy resins—e.g., bisphenol A resins, bisphenol F resins, cycloaliphatic epoxy resins, and mixtures thereof—cyanate esters, siloxiranes, maleimides, polybenzoxazines, polyimides, silicones, epoxy-acrylates, liquid crystal polymers, or the like (including any of various combinations and/or derivatives thereof). Curing of the first material is provided, for example, by heat, ultraviolet (UV) light, and/or the like— wherein such curing hardens the first material to a degree that matches the lateral-motion rigidity of carrier wafer 302. In some embodiments, the first material further comprises fillers—such as particulates or fibers of silica and/or any of various other suitable materials—which (for example) contribute to an increased modulus of elasticity of the first material, and/or contribute to a decreased coefficient of thermal expansion (CTE) of the first material.

In some embodiments, the second material of body 307 comprises any of various inorganic, dielectric compounds which (for example) include one or more oxides and/or one or more nitrides. In one such embodiment, the second material comprises any of various silicon oxide compounds—such as $SiO_2$, a silicate compound, a siloxane compound, or the like—and/or any of various silicon nitride compounds (including any of various combinations and/or derivatives thereof). In one example embodiment, body 307 is formed by using a dip coating process, a spin coating process, a sol-gel, and/or any of various other suitable processes to deposit the second material. By way of illustration and not limitation, the second material comprises a spin-on glass material which is efficiently deposited into fills cavities and/or other recess structures of device 300d. In another embodiment, body 307 is formed by a deposition of the second material using an injection mold process. In still another embodiment, body 307 is formed by an application of a soft film which comprises the second material.

Figure 3E:
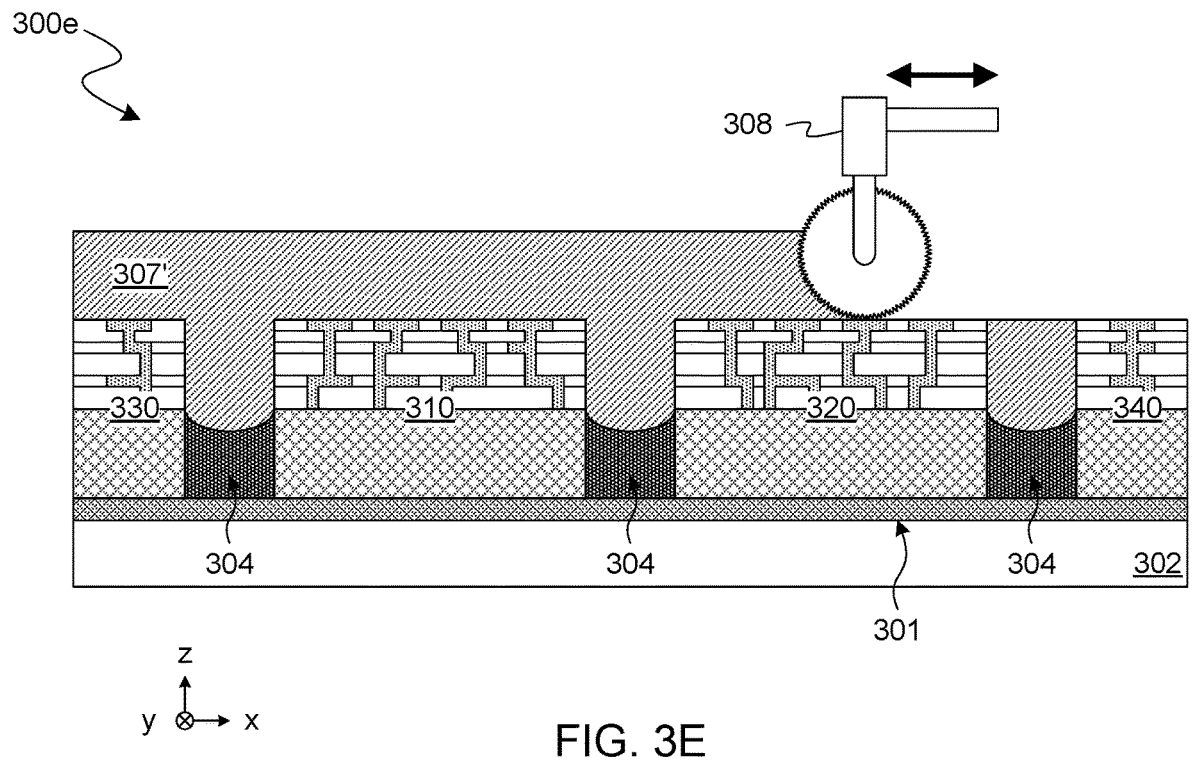

FIG. 3E shows a cross-sectional side view of a device 300e which is a result of additional processing of device 300d shown in FIG. 3D according to an embodiment. Device 300e is depicted during processing to remove some of the rigid mass which is formed by body 304 and body 307 (wherein an intermediate body 307' is being subjected to grinding polishing and/or other subtractive processing). In the example embodiment shown, a grinding wheel 308 is used to form another rigid mass from the rigid mass which had previously been formed by body 304 and body 307. Grinding wheel 308 is depicted as providing or otherwise facilitating the exposure of various conductive contacts on the respective back side surfaces of dies 310, 320, 330, 340. Various additional or alternative methods are used to remove portions of body 307 and expose such conductive contacts, in some embodiments. For example, in one such embodiment, a polishing pad (not shown) is used after grinding wheel 308 to further expose the respective back side surfaces of dies 310, 320, 330, 340.

Figure 3F:
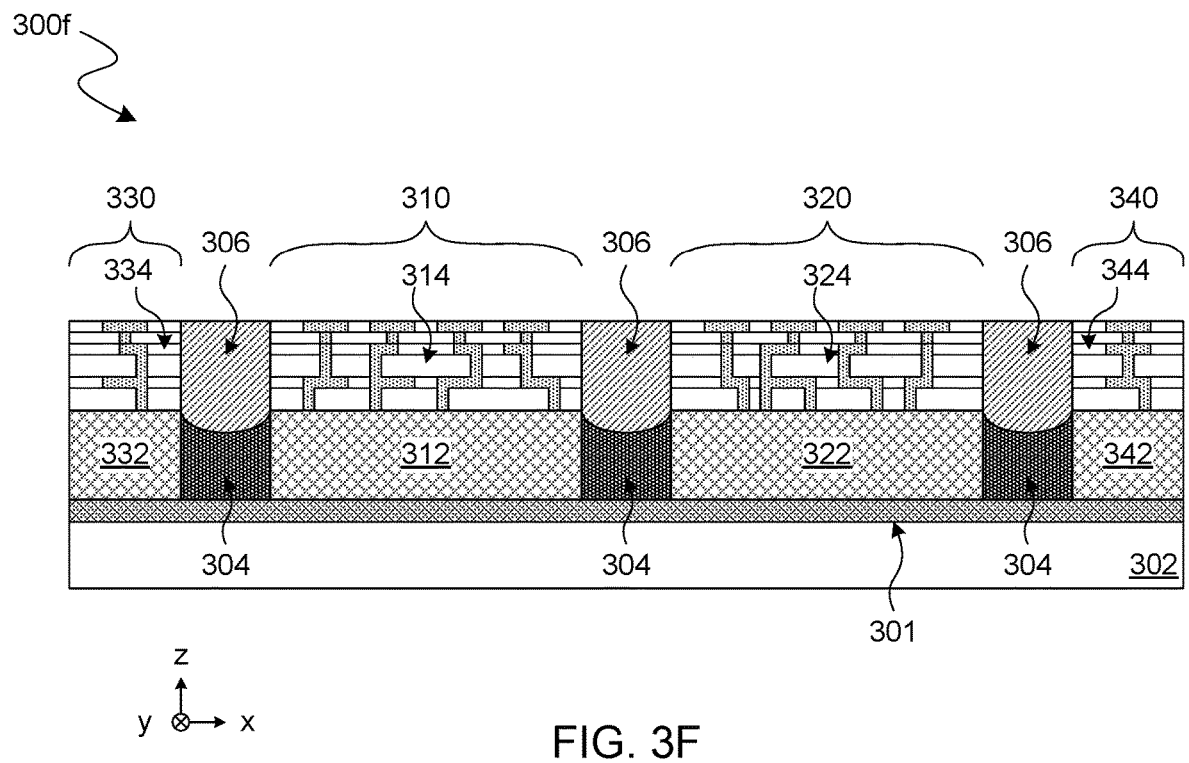

FIG. 3F shows a cross-sectional side view of a device 300f which is a result of additional processing of device 300e shown in FIG. 3E according to an embodiment. Device 300f is depicted after completion of the processing to grind and/or otherwise remove portions of body 307, wherein such processing results in the formation of a body 306 comprising remaining portions of body 307. For example, various portions of body 306 variously extend each between a respective two of ID dies 310, 320, 330, 340 and to an adjoining portion of surface 305. In various embodiments, grinding, polishing and/or other processing to remove portions of body 307 is performed with precision z-directional control to stop on the respective conductive contacts which are formed in or on the various back side surfaces of dies 310, 320, 330, 340. For example, after such processing, an upward facing surface of body 306 is parallel to (and, for example, co-planar with) said back side surfaces.

Although some embodiments are not limited in this regard, device 300f is subject to additional processing (not shown) which, for example, facilitates the packaging of a reconstituted circuit device comprising some or all of IC dies 310, 320, 330, 340, and further comprising a rigid mass formed by respective portions of body 304 and body 306. For example, such additional processing comprises removing carrier wafer 302 and adhesive layer 301 to expose the respective front side surfaces of IC dies 310, 320, 330, 340. Removal of carrier wafer 302 and adhesive layer 301 also exposes a downward facing surface of the rigid mass comprising body 304 and body 306. In some embodiments, portions of device 300f are diced or otherwise singulated from each other—e.g., to form multiple reconstituted circuit devices each comprising a respective two or more IC dies.

Figure 4:
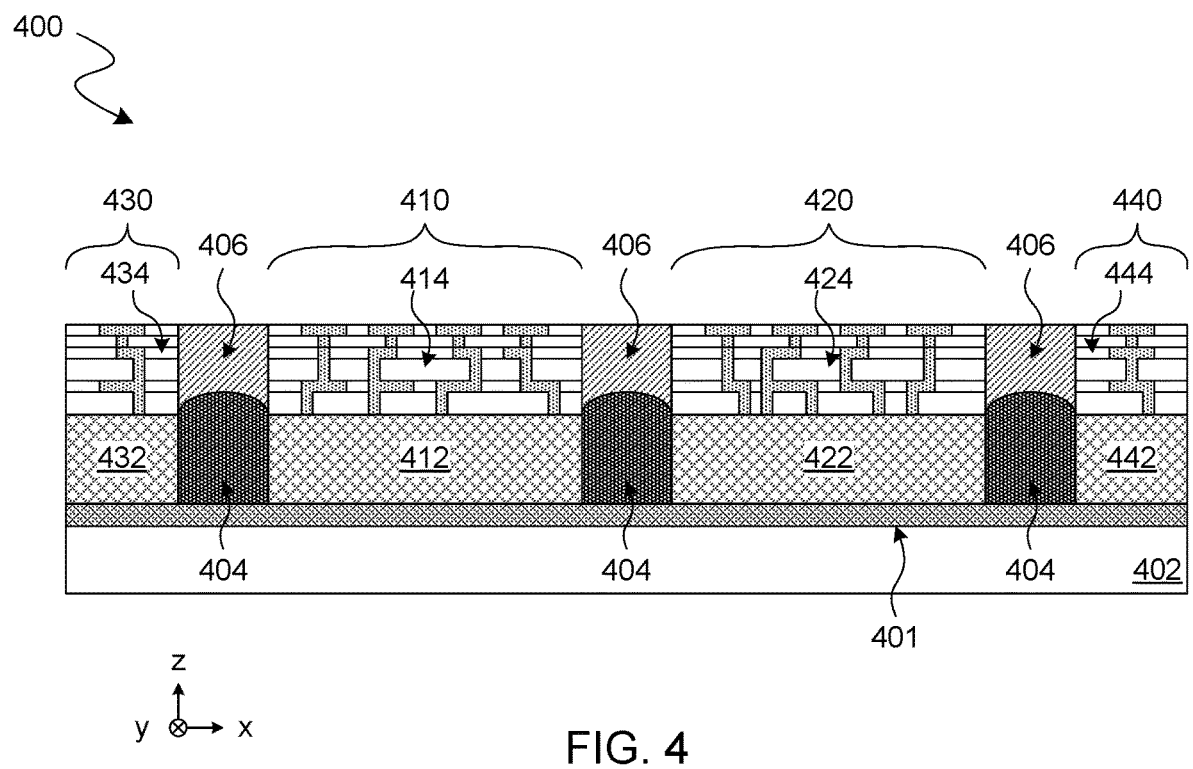
FIGS. 4 through 6 show cross-sectional side view diagrams each illustrating features of a respective device comprising structures formed by a capillary flow of a material according to a corresponding embodiment.

FIG. 4 shows features of a device 400 comprising structures formed by a capillary flow of a material according to an embodiment. Device 400 illustrates one example of an embodiment wherein a portion of a rigid mass forms a convex surface at an interface with another portion of that same rigid mass. In various embodiments, device 400 includes features of device 102 or device 300f—e.g., wherein one or more operations of method 200 are performed to provide such features of device 400.

As shown in FIG. 4, device 400 comprises multiple dies (such as the illustrative IC dies 410, 420, 430, 440 shown) which are coupled to a carrier wafer 402 via an adhesive layer 401. For example, IC dies 410, 420, 430, and 440 correspond functionally to dies 310, 320, 330, and 340—e.g., wherein adhesive layer 401 and carrier wafer 402 correspond functionally to adhesive layer 301 and carrier wafer 302 (respectively). In other embodiments, device 400 omits one or both or IC dies 430, 440 and/or omits carrier wafer 402 and adhesive layer 401.

In the example embodiment shown, IC die 410 comprises active circuit structures 412 and BEOL structures 414 which are positioned over active circuit structures 412 (e.g., wherein active circuit structures 412 and BEOL structures 414 correspond to active circuit structures 312 and BEOL structures 314, respectively). Similarly, IC die 420 comprises active circuit structures 422 and BEOL structures 424 which are positioned over active circuit structures 422. Furthermore, IC die 430 comprises active circuit structures 432 and BEOL structures 434 which are positioned over active circuit structures 432—e.g., wherein IC die 440 comprises active circuit structures 442 and BEOL structures 444 which are positioned over active circuit structures 442.

In an embodiment, a rigid mass of device 400 comprises a body 404 of a first material, and another body 406 of a second material. The rigid mass variously adjoins (and, for example, extends between) some or all of IC dies 410, 420, 430, 440—e.g., wherein bodies 404, 406 have various features of bodies 304, 306, respectively. In some embodiments, device 400 comprises more, fewer, and/or differently arranged IC dies within the rigid mass formed by body 404 and body 406.

In various embodiments, a portion of body 404 (the portion between two IC dies) forms a surface structure which is an artefact of a flow of the first material by capillary action. For example, a first portion of body 404 forms a first convex surface structure between IC dies 410, 420—e.g., wherein a second portion of body 404 forms a second convex surface structure between IC dies 410, 430, and wherein a third portion of body 404 forms a third convex surface structure between IC dies 420, 440. Some or all such convex surface structures of body 404 each result, for example, from a respective meniscus which the first material forms due to capillary action while in a liquid, flowable state. In an embodiment, a given portion of body 404 forms a convex surface structure (rather than a concave surface structure, for example) due at least in part to a fluid pressure of the first material prior to a curing thereof.

Figure 5:
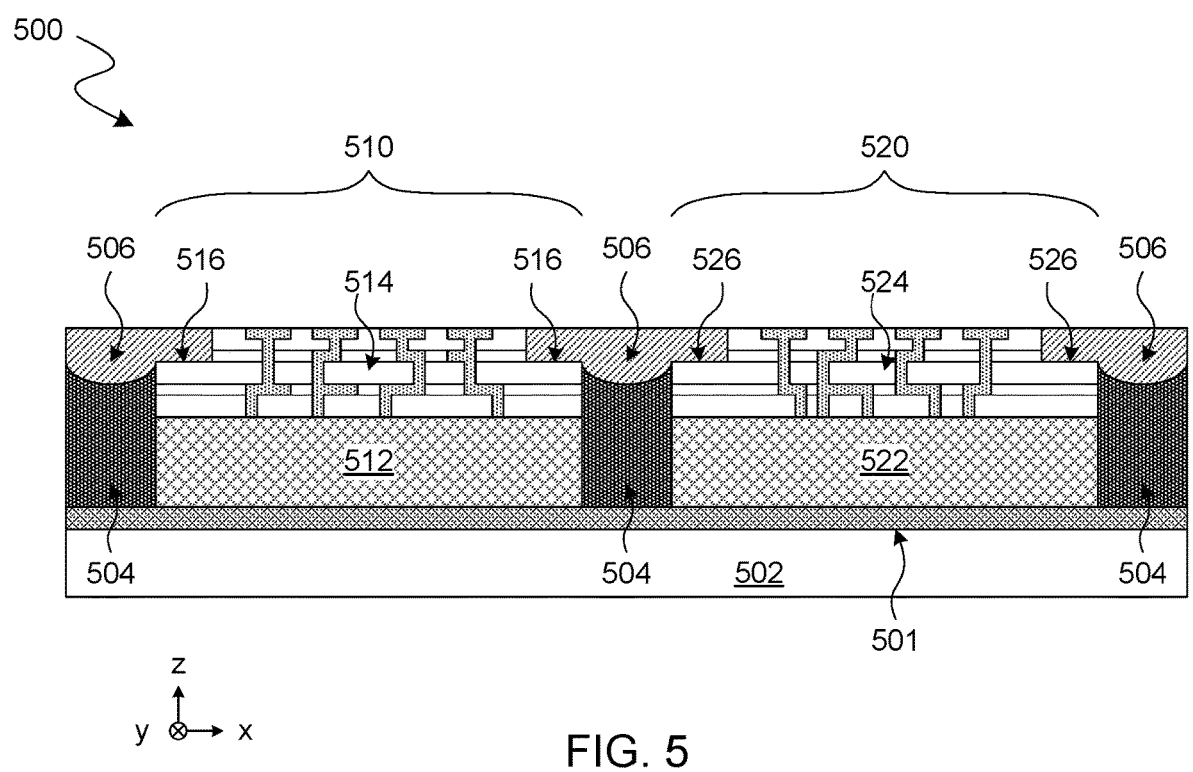

FIG. 5 shows features of a device 500 comprising structures formed by a capillary flow of a material according to another embodiment. Device 500 illustrates one example of an embodiment wherein a first material of a rigid mass—the first material forming an artefact of a flow by capillary action—extends vertically, between two dies, to adjoin one or more BEOL layers of a die. In various embodiments, device 500 includes features of one of devices 102, 300f, 400—e.g., wherein one or more operations of method 200 are performed to provide such features of device 500.

As shown in FIG. 5, device 500 comprises multiple dies (such as the illustrative IC dies 510, 520 shown) which are coupled to a carrier wafer 502 via an adhesive layer 501. For example, IC dies 510, 520 correspond functionally to dies 310, 320—e.g., wherein adhesive layer 501 and carrier wafer 502 correspond functionally to adhesive layer 301 and carrier wafer 302 (respectively). In other embodiments, device 500 omits carrier wafer 502 and adhesive layer 501.

In the example embodiment shown, IC die 510 comprises active circuit structures 512 and BEOL structures 514 which are positioned over active circuit structures 512 (e.g., wherein active circuit structures 512 and BEOL structures 514 correspond to active circuit structures 312 and BEOL structures 314, respectively). Similarly, IC die 520 comprises active circuit structures 522 and BEOL structures 524 which are positioned over active circuit structures 522.

In an embodiment, a rigid mass of device 500 comprises a body 504 of a first material, and another body 506 of a second material. The rigid mass variously adjoins (and, for example, extends between) IC dies 510, 520—e.g., wherein bodies 504, 506 have various features of bodies 304, 306, respectively. In some embodiments, device 500 comprises more, fewer, and/or differently arranged IC dies within the rigid mass formed by body 504 and body 506. In various embodiments, one or more portions of body 504 each form a respective surface structure which is an artefact of a flow of the first material by capillary action. For example, a first portion of body 504 forms a first concave surface structure between IC dies 510, 520—e.g., wherein a second portion of body 504 forms a second concave surface structure on an opposite side of IC die 510, and/or wherein a third portion of body 504 forms a third concave surface structure on an opposite side of IC die 520. Alternatively, body 504 instead forms one or more convex surface structures, for example.

In the illustrative embodiment shown, body 504 extends along respective sidewalls of IC die 510 and IC die 520—e.g., wherein body 504 extends vertically past active circuit structures 512 to adjoin one or more layers of BEOL structures 514 (and/or extends vertically past active circuit structures 522 to adjoin one or more layers of BEOL structures 524). In one such embodiment, BEOL structures 514 form stepped structures 516 to facilitate a separation of body 504 from one or more conductive contacts which are formed in or on a first back side surface of IC die 510. For example, stepped structures 516 help accommodate a marginal error in how far the first material of body 504 is to flow vertically by capillary action along sidewall structures of IC die 510. Additionally or alternatively, BEOL structures 524 form stepped structures 526 to facilitate separation of body 504 from one or more conductive contacts which are formed in or on a second back side surface of IC die 520.

Figure 6:
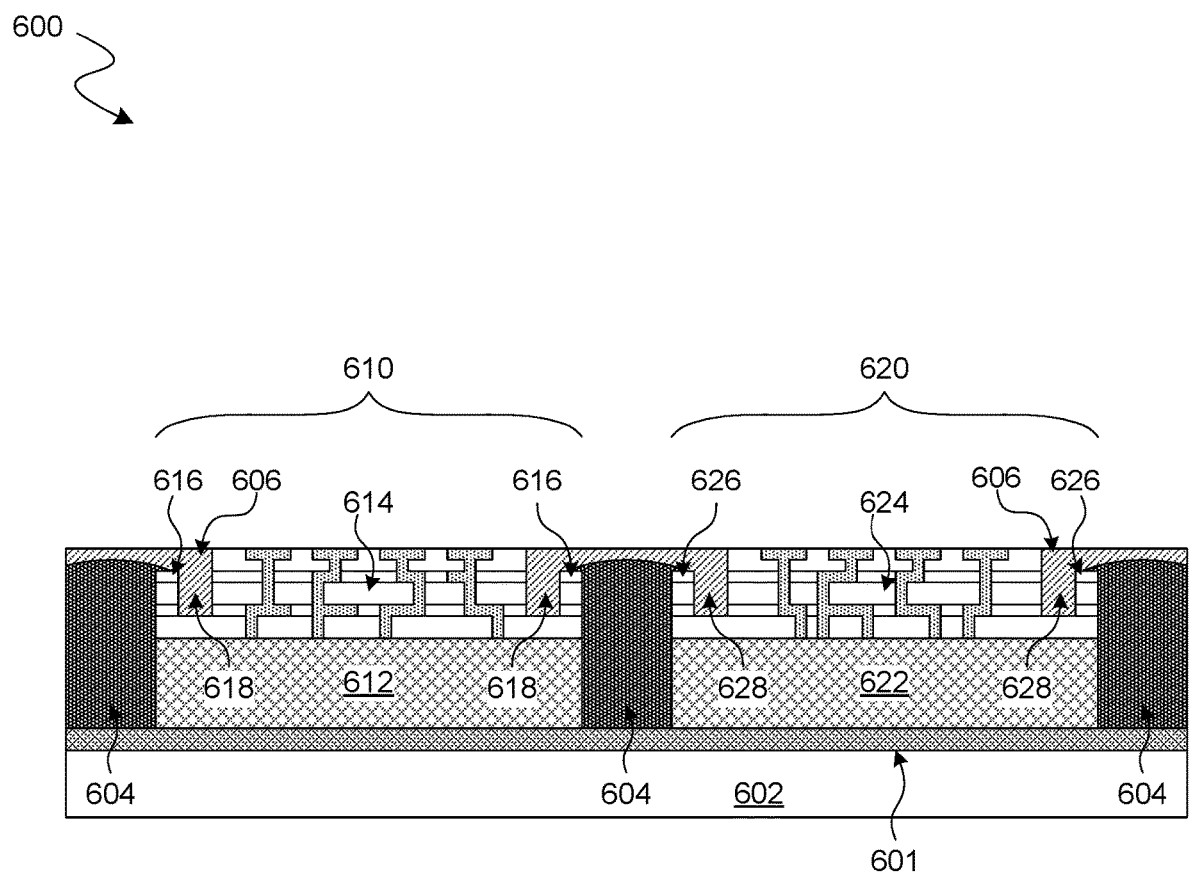

FIG. 6 shows features of a device 600 comprising structures formed by a capillary flow of a material according to another embodiment. Device 600 illustrates one example of an embodiment wherein a first material of a rigid mass—the first material forming an artefact of a flow by capillary action—extends to a lip structure which is formed by BEOL layers of a die. In various embodiments, device 600 includes features of one of devices 102, 300f, 400, 500—e.g., wherein one or more operations of method 200 are performed to provide such features of device 600.

As shown in FIG. 6, device 600 comprises IC dies 610, 620 which are coupled to a carrier wafer 602 via an adhesive layer 601. For example, IC dies 610, 620 correspond functionally to dies 310, 320—e.g., wherein adhesive layer 601 and carrier wafer 602 correspond functionally to adhesive layer 301 and carrier wafer 302 (respectively). In other embodiments, device 600 omits carrier wafer 602 and adhesive layer 601.

In the example embodiment shown, IC die 610 comprises active circuit structures 612 and BEOL structures 614 which are positioned over active circuit structures 612 (e.g., wherein active circuit structures 612 and BEOL structures 614 correspond to active circuit structures 312 and BEOL structures 314, respectively). Similarly, IC die 620 comprises active circuit structures 622 and BEOL structures 624 which are positioned over active circuit structures 622.

A rigid mass of device 600 comprises a body 604 of a first material, and another body 606 of a second material. The rigid mass variously adjoins (and, for example, extends between) IC dies 610, 620—e.g., wherein bodies 604, 606 have various features of bodies 304, 306, respectively. In some embodiments, device 600 comprises more, fewer, and/or differently arranged IC dies within the rigid mass formed by body 604 and body 606. In various embodiments, one or more portions of body 604 each form a respective surface structure which is an artefact of a flow of the first material by capillary action. For example, a first portion of body 604 forms a first concave surface structure between IC dies 610, 620—e.g., wherein a second portion of body 604 forms a second concave surface structure on an opposite side of IC die 610, and/or wherein a third portion of body 604 forms a third concave surface structure on an opposite side of IC die 620. Alternatively, body 604 instead forms one or more convex surface structures, for example.

In the illustrative embodiment shown, body 604 extends along respective sidewalls of IC die 610 and IC die 620—e.g., wherein body 604 extends vertically past active circuit structures 612 to adjoin one or more layers of BEOL structures 614 (and/or extends vertically past active circuit structures 622 to adjoin one or more layers of BEOL structures 624). In one such embodiment, BEOL structures 614 form lip structures 616, and adjoining recess structures 618, which variously extend horizontally (in the x-y plane) along an edge of BEOL structures 614. By way of illustration and not limitation, lip structures 616 and recess structures 618 are formed by laser etching, plasma etching and/or other suitable patterning of one or more layers of BEOL structures 614. Lip structures 616 and recess structures 618 facilitate a separation of body 604 from one or more conductive contacts which are formed in or on a first back side surface of IC die 610. For example, lip structures 616 mitigate the possibility of an overflow (if any) of the first material into recess structures 618, which are able to accommodate at least some of said overflow. In one such embodiment, BEOL structures 624 additionally or alternatively form lip structures 626, and adjoining recess structures 628, to similarly facilitate separation of body 604 from one or more conductive contacts which are formed in or on a second back side surface of IC die 620.

Figure 7:
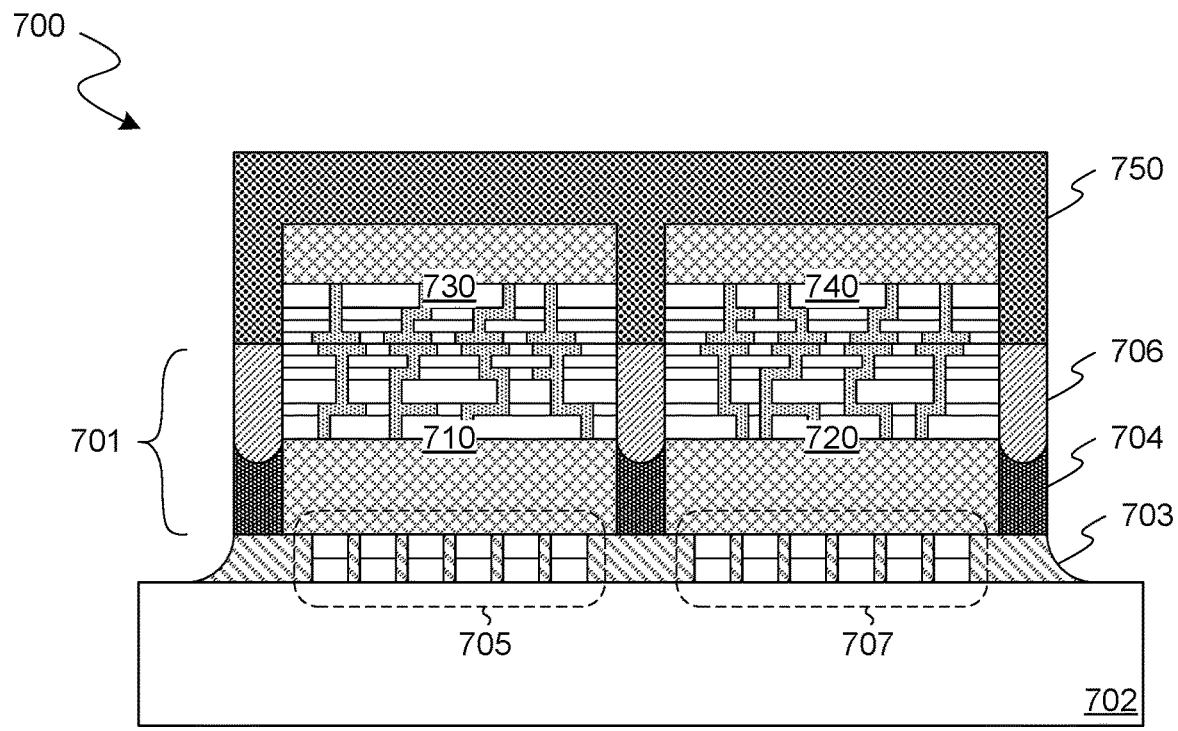
FIGS. 7 through 9 show cross-sectional side view diagrams each illustrating features of a respective packaged device comprising a reconstituted circuit structure according to a corresponding embodiment.

FIG. 7 shows features of a packaged device 700 comprising a reconstituted circuit structure according to an embodiment. Packaged device 700 illustrates one example of an embodiment wherein one or more dies are each hybrid bonded or otherwise coupled to one or more other dies of a reconstituted circuit device. In various embodiments, a reconstituted circuit device of packaged device 700 includes features of one of devices 102, 300*f*, 400, 500, 600—e.g., wherein one or more operations of method 200 are performed to provide structures of the reconstituted circuit device.

As shown in FIG. 7, packaged device 700 comprises a reconstituted circuit device 701 which is wire bonded, flip chip connected, or otherwise coupled to an underlying substrate 702—e.g., wherein substrate 702 is an organic substrate, an interposer or (for example) a printed circuit board.

By way of illustration and not limitation, device 701 comprises IC dies 710, 720 and a rigid mass which adjoins and extends between (and for example, around) IC dies 710, 720. The rigid mass comprises a body 704 of a first material, and an adjoining body 706 of a second material, wherein body 704 forms one or more concave (or alternatively, convex) surface structures at an interface with body 706. A first interface 705 between device 701 and substrate 702 is formed where first conductive contacts (e.g., copper pads)—formed in or on an upward facing surface of substrate 702—are hybrid bonded or otherwise coupled each to a corresponding one of conductive contacts at a first front side surface of IC die 710. Alternatively or in addition, a second interface 707 between device 701 and substrate 702 is formed where second conductive contacts—formed in or on the upward facing surface of substrate 702—are hybrid bonded or otherwise coupled each to a corresponding one of conductive contacts at a second front side surface of IC die 720.

In some embodiments, an underfill 703 is formed between device 701 and substrate 702—e.g., wherein underfill 703 extends under dies 710, 720, and under the rigid mass formed by bodies 704, 706. In one such embodiment, underfill 703 and body 704 comprise different respective materials, or a material discontinuity is otherwise formed where respective surfaces of underfill 703 and body 704 adjoin each other.

In the example embodiment shown, packaged device 700 further comprises one or more additional IC dies (such as the illustrative dies 730, 740 shown) which are each hybrid bonded or otherwise coupled to device 701 via IC die 710 and/or IC die 720. For example, a back side surface of die 710 has formed therein or thereon conductive contacts which are coupled each to a respective one of other conductive contacts, which are formed in or on an adjoining back side surfaces of die 730. Alternatively or in addition, a back side surface of die 720 has formed therein or thereon conductive contacts which are coupled each to a respective one of other conductive contacts, which are formed in or on an adjoining back side surfaces of die 740. In one such embodiment, packaged device 700 further comprises a mold compound 750 which is injection molded or otherwise deposited over some or all of body 706, IC die 730, and IC die 740.

In another embodiment, dies 730, 740 are instead implemented as a single continuous die structure which covers a horizontal (x-y) span of dies 710, 720. In still another embodiment, reconstituted circuit device 701 instead has an orientation in packaged device 700 which is opposite to that shown—e.g., wherein reconstituted circuit device 701 is disposed over one or more dies of packaged device, and where (for example) said dies 710, 720 are coupled to substrate 702 via said one or more dies. In various embodiments, packaged device 700 comprises interconnect structures which facilitate communication between substrate 702 and the various dies thereon—e.g., wherein die 710 and/or die 720 comprise respective through silicon vias (TSVs) which are coupled to substrate 702 each via a respective one of first interface 705 or second interface 707. In some embodiments, packaged device 700 further comprises one or more additional dies (not shown) which, for example, are each on a respective one of dies 730, 740—e.g., wherein die 730 and/or die 740 comprise respective TSVs to facilitate coupling with said one or more additional dies.

Figure 8:
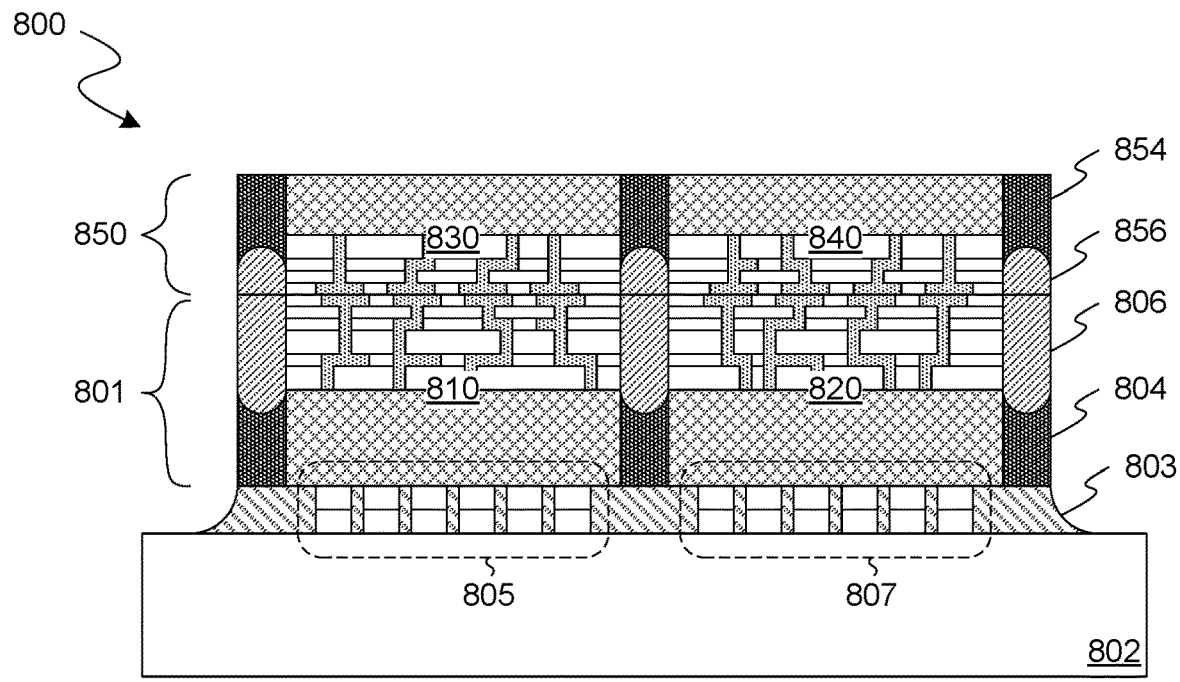

FIG. 8 shows features of a packaged device 800 comprising a reconstituted circuit structure according to an embodiment. Packaged device 800 illustrates an example of an embodiment wherein one reconstituted circuit device is hybrid bonded or otherwise coupled to another reconstituted circuit device. In various embodiments, a given reconstituted circuit device of packaged device 800 includes features of one of devices 102, 300*f*, 400, 500, 600—e.g., wherein one or more operations of method 200 are performed to provide structures of the reconstituted circuit device.

As shown in FIG. 8, packaged device 800 comprises a reconstituted circuit device 801 which is wire bonded, flip chip connected, or otherwise coupled to an underlying substrate 802—e.g., wherein substrate 802 is an organic substrate, an interposer, a printed circuit board, or the like.

By way of illustration and not limitation, device 801 comprises IC dies 810, 820 and a first rigid mass which adjoins and extends between (and for example, around) IC dies 810, 820. The first rigid mass comprises a body 804 of a first material, and an adjoining body 806 of a second material, wherein body 804 forms one or more concave (or alternatively, convex) surface structures at an interface with body 806. A first interface 805 between device 801 and substrate 802 is formed where first conductive contacts (e.g., copper pads)—formed in or on an upward facing surface of substrate 802—are hybrid bonded or otherwise coupled each to a corresponding one of conductive contacts at a first front side surface of IC die 810. Alternatively or in addition, a second interface 807 between device 801 and substrate 802 is formed where second conductive contacts—formed in or on the upward facing surface of substrate 802—are hybrid bonded or otherwise coupled each to a corresponding one of conductive contacts at a second front side surface of IC die 820.

In some embodiments, an underfill 803 is formed between device 801 and substrate 802—e.g., wherein underfill 803 extends under dies 810, 820, and under the first rigid mass formed by bodies 804, 806. In one such embodiment, underfill 803 and body 804 comprise different respective materials, or a material discontinuity is otherwise formed where respective surfaces of underfill 803 and body 804 adjoin each other.

In the example embodiment shown, packaged device 800 further comprises another reconstituted circuit device 850 which includes IC dies 830, 840 and a second rigid mass which adjoins and extends between IC dies 830, 840. The second rigid mass comprises a body 854 of a third material, and an adjoining body 856 of a fourth material, wherein body 854 forms one or more concave (or alternatively, convex) surface structures at an interface with body 856. By way of illustration and not limitation, the third material comprises an organic polymer such as any of various epoxy resins—e.g., wherein the fourth material comprises an inorganic compound (such as a spin on glass material) which includes any of various oxides or any of various nitrides. In some embodiments, the first material of body 804 is the same as the third material of body 854—e.g., wherein the second material of body 806 is the same as the fourth material of body 856.

In the example embodiment shown, dies 830, 840 are each hybrid bonded or otherwise coupled to device 801 via IC die 810 and IC die 820 (respectively). For example, an upward facing back side surface of die 810 has formed therein or thereon conductive contacts which are coupled each to a respective one of other conductive contacts, which are formed in or on an adjoining, downward facing back side surfaces of die 830. Alternatively or in addition, a back side surface of die 820 has formed therein or thereon conductive contacts which are coupled each to a respective one of other conductive contacts, which are formed in or on an adjoining back side surfaces of die 840. In various embodiments, packaged device 800 further comprises a mold compound (not shown) which encapsulates or is otherwise disposed on or around device 801 and/or device 850.

In some embodiments, one of reconstituted circuit devices 801, 850 comprises one die which is coupled to, and covers a horizontal span of, multiple dies of the other of devices 801, 850. In various embodiments, packaged device 800 comprises interconnect structures which facilitate communication between substrate 802 and the various dies thereon—e.g., wherein die 810 and/or die 820 comprise respective TSVs which are coupled to substrate 802 each via a respective one of first interface 805 or second interface 807. In some embodiments, packaged device 800 further comprises one or more additional dies (not shown) which, for example, are each on a respective one of dies 830, 840—e.g., wherein die 830 and/or die 840 comprise respective TSVs to facilitate coupling with said one or more additional dies.

Figure 9:
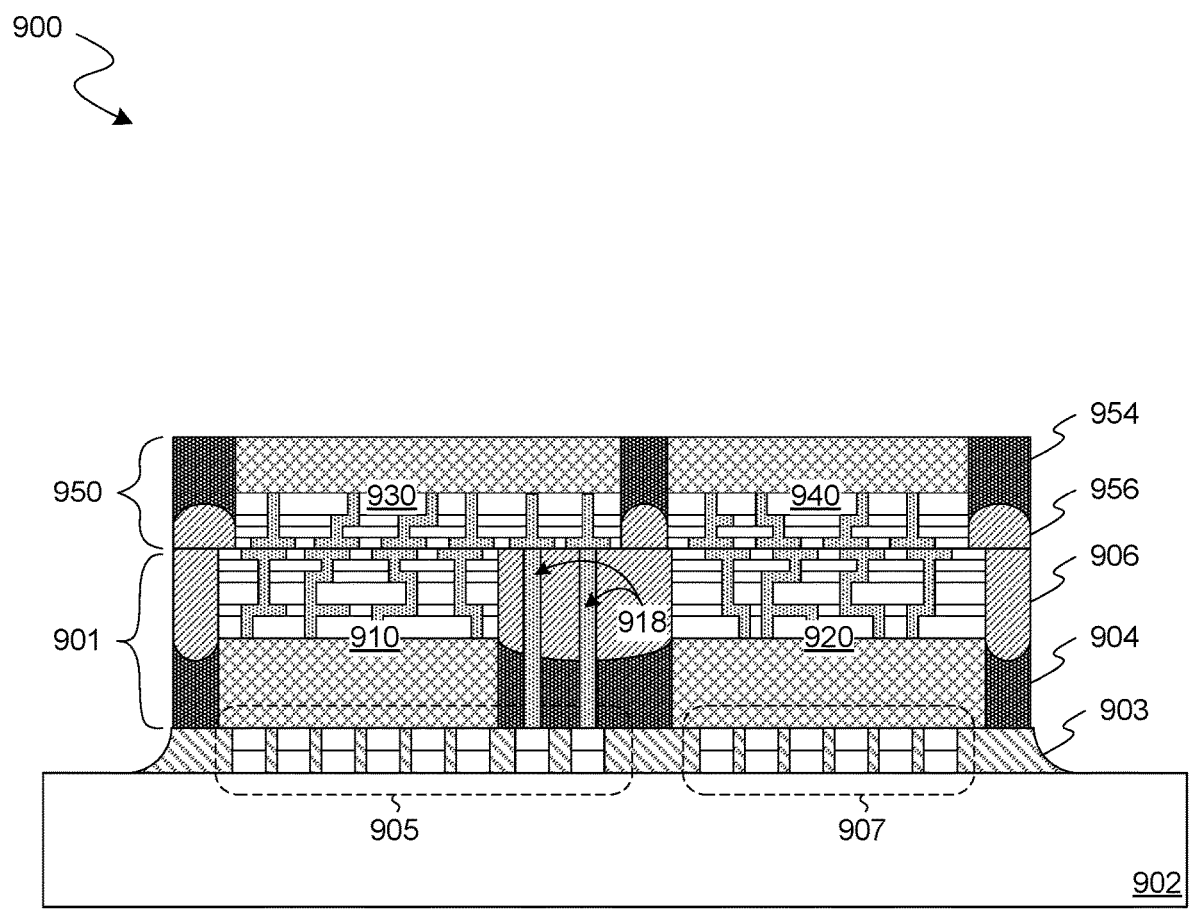

FIG. 9 shows features of a packaged device 900 comprising a reconstituted circuit structure according to another embodiment. Packaged device 900 illustrates an example of an embodiment wherein one or more interconnect structures provide electrical connectivity each through a rigid mass of a reconstituted circuit device. In various embodiments, a given reconstituted circuit device of packaged device 800 includes features of one of devices 102, 300f, 400, 500, 600—e.g., wherein one or more operations of method 200 are performed to provide structures of the reconstituted circuit device.

As shown in FIG. 9, packaged device 900 comprises a first reconstituted circuit device 901, a substrate 902 which is electrically coupled at a downward facing first side of device 901, and a second reconstituted circuit device 950 which is coupled electrically at an upward facing second side of device 901. In the example embodiment shown, device 901 comprises IC dies 910, 920 and a first rigid mass which adjoins and extends between (and for example, around) IC dies 910, 920. The first rigid mass comprises a body 904 of a first material, and an adjoining body 906 of a second material, wherein body 904 forms one or more concave (or alternatively, convex) surface structures at an interface with body 906.

Similarly, device 950 comprises IC dies 930, 940 and a second rigid mass which adjoins and extends between (and for example, around) IC dies 930, 940. The second rigid mass comprises a body 954 of a third material, and an adjoining body 956 of a fourth material, wherein body 954 forms one or more concave (or alternatively, convex) surface structures at an interface with body 956. Interfaces 905, 907 variously couple device 901 to substrate 902 via IC die 910 and IC die 920 (respectively)—e.g., wherein contacts of IC die 910 are hybrid bonded to corresponding contacts of IC die 930, and/or contacts of IC die 920 are hybrid bonded to corresponding contacts of IC die 940. In one such embodiment, devices 901, 950 correspond to devices 801, 850, respectively—e.g., wherein dies 910, 920, 930, 940 have features of dies 810, 820, 830, 840 (respectively), and where interfaces 905, 907 correspond functionally to interfaces 805, 807, respectively.

In various embodiments, packaged device 900 further comprises interconnect structures—e.g., including one or more vias—which provide electrical connectivity through a rigid mass of a reconstituted circuit device. In one such embodiment, some or all such interconnect structures extend through an interface between two bodies which form said rigid mass. By way of illustration and not limitation, packaged device 900 further comprises vias 918 which variously extend through (and adjoin) bodies 904, 906 of the first rigid mass to provide electrical coupling between device 950 and interface 905.

In an embodiment, one or more dies of reconstituted circuit device 901 each comprise respective TSVs coupled to substrate 902—e.g., each via a respective one of first interface 905 or second interface 907. In various embodiments, packaged device 900 further comprises one or more additional dies (not shown) which, for example, are each on a respective one of dies 930, 940—e.g., wherein die 930 and/or die 940 comprise respective TSVs to facilitate coupling with said one or more additional dies.

Figure 10:
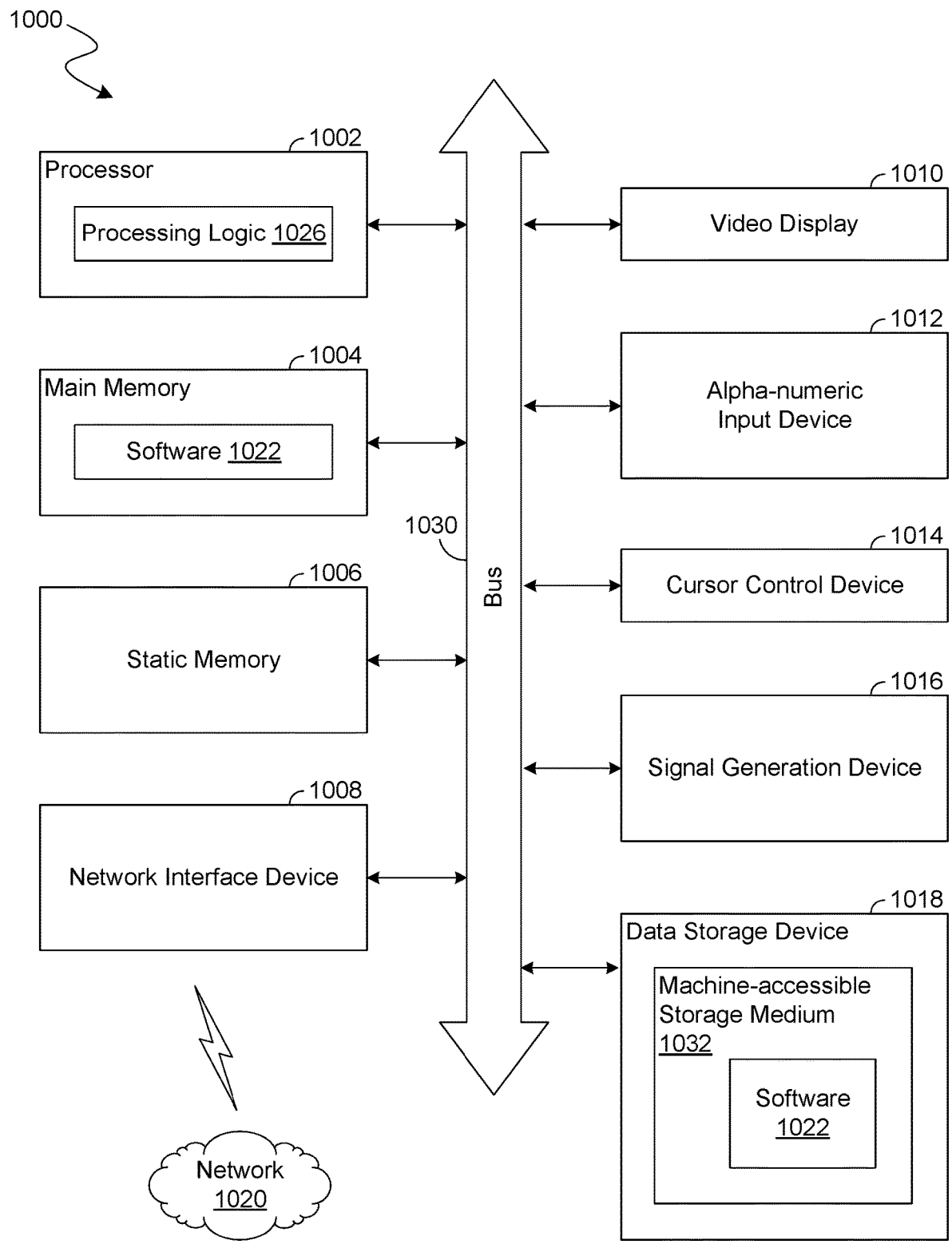
FIG. 10 is a functional block diagram illustrating an exemplary computer system, in accordance with one embodiment.

FIG. 10 illustrates a diagrammatic representation of a machine in the exemplary form of a computer system 1000 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1000 includes a processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

Processor 1002 represents one or more general-purpose processing devices such as a microprocessor, central processing unit, or the like. More particularly, the processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. Processor 1002 is configured to execute the processing logic 1026 for performing the operations described herein.

The computer system 1000 may further include a network interface device 1008. The computer system 1000 also may include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium (or more specifically a computer-readable storage medium) 1032 on which is stored one or more sets of instructions (e.g., software 1022) embodying any one or more of the methodologies or functions described herein. The software 1022 may also reside, completely or at least partially, within the main memory 1004 and/or within the processor 1002 during execution thereof by the computer system 1000, the main memory 1004 and the processor 1002 also constituting machine-readable storage media. The software 1022 may further be transmitted or received over a network 1020 via the network interface device 1008.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 11:
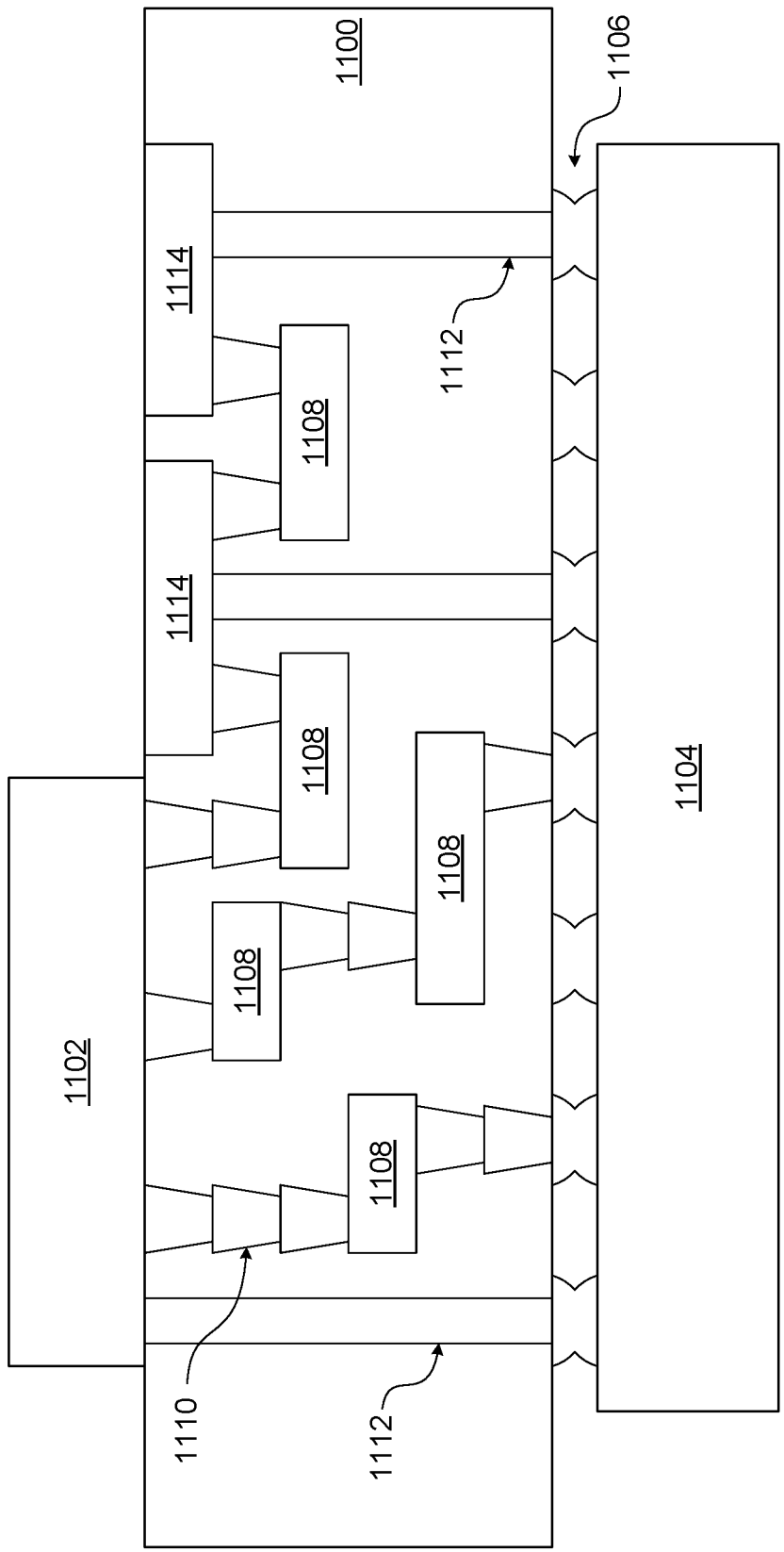
FIG. 11 is a cross-sectional view of an interposer implementing one or more embodiments.

FIG. 11 illustrates an interposer 1100 that includes one or more embodiments. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102, 1104 are attached to opposing sides of the interposer 1100. In other embodiments, the first and second substrates 1102, 1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with some embodiments, apparatuses or processes disclosed herein may be used in the fabrication of interposer 1100.

Techniques and architectures for providing structures of a reconstituted circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

In one or more first embodiments, a device comprises a first die comprising a first sidewall structure, a second die comprising a second sidewall structure which faces the first sidewall structure, and a rigid mass which extends around the first die and the second die, the rigid mass comprising a first body comprising a first material, wherein a first portion of the first body extends across a region, between the first die and the second die, to each of the first sidewall structure and the second sidewall structure, wherein the first portion forms in the region a surface structure which is concave or convex, and a second body of a second material other than the first material, wherein a second portion of the second body extends across the region to each of the first sidewall structure and the second sidewall structure, wherein the second portion adjoins the surface structure.

In one or more second embodiments, further to the first embodiment, a thickness of the second body within the region is equal to or less than 20 microns.

In one or more third embodiments, further to the first embodiment or the second embodiment, the device further comprises a third die comprising a third sidewall structure, a fourth die comprising a fourth sidewall structure which faces the third sidewall structure, and a second rigid mass which extends around the third die and the fourth die, the second rigid mass comprising a third body comprising a third material, wherein a third portion of the third body extends across a second region, between the third die and the fourth die, to each of the third sidewall structure and the fourth sidewall structure, wherein the third portion forms in the second region a second surface structure which is concave or convex, and a fourth body of a fourth material other than the third material, wherein a fourth portion of the fourth body extends across the second region to each of the third sidewall structure and the fourth sidewall structure, wherein the fourth portion adjoins the second surface structure, wherein first electrical contacts of the first die are electrically coupled each to a different respective one of second electrical contacts of the third die.

In one or more fourth embodiments, further to any of the first through third embodiments, the device further comprises an interconnect structure which extends through the first body and the second body to each of two opposite sides of the rigid mass.

In one or more fifth embodiments, further to any of the first through fourth embodiments, the first die comprises a dummy die.

In one or more sixth embodiments, further to any of the first through fourth embodiments, the first die comprises first back end of line (BEOL) structures, and wherein the first body and the second body each adjoin the first BEOL structures.

In one or more seventh embodiments, further to the sixth embodiment, the first BEOL structures comprise a lip structure which forms in part the first sidewall structure, and wherein the first body and the second body each adjoin the lip structure.

In one or more eighth embodiments, further to the sixth embodiment, the first BEOL structures comprise a step structure which forms in part the first sidewall structure, the first body extends to a height along the first sidewall structure which is below the step structure, and the second body adjoins the step structure.

In one or more ninth embodiments, further to any of the first through fourth embodiments, the first material comprises an organic polymer, and wherein the second material comprises an inorganic compound.

In one or more tenth embodiments, further to the ninth embodiment, the organic polymer comprises an epoxy resin, and wherein the inorganic compound comprises one of an oxide compound or a nitride compound.

In one or more eleventh embodiments, a system comprises a packaged device comprising a first die comprising a first sidewall structure, a second die comprising a second sidewall structure which faces the first sidewall structure, and a rigid mass which extends around the first die and the second die, the rigid mass comprising a first body comprising a first material, wherein a first portion of the first body extends across a region, between the first die and the second die, to each of the first sidewall structure and the second sidewall structure, wherein the first portion forms in the region a surface structure which is concave or convex, and a second body of a second material other than the first material, wherein a second portion of the second body extends across the region to each of the first sidewall structure and the second sidewall structure, wherein the second portion adjoins the surface structure, and a display device coupled to the packaged device, the display device to display an image based on signals communicated with the first die or the second die.

In one or more twelfth embodiments, further to the eleventh embodiment, a thickness of the second body within the region is equal to or less than 20 microns.

In one or more thirteenth embodiments, further to the eleventh embodiment or the twelfth embodiment, the packaged device further comprises a third die comprising a third sidewall structure, a fourth die comprising a fourth sidewall structure which faces the third sidewall structure, and a second rigid mass which extends around the third die and the fourth die, the second rigid mass comprising a third body comprising a third material, wherein a third portion of the third body extends across a second region, between the third die and the fourth die, to each of the third sidewall structure and the fourth sidewall structure, wherein the third portion forms in the second region a second surface structure which is concave or convex, and a fourth body of a fourth material other than the third material, wherein a fourth portion of the fourth body extends across the second region to each of the third sidewall structure and the fourth sidewall structure, wherein the fourth portion adjoins the second surface structure, wherein first electrical contacts of the first die are electrically coupled each to a different respective one of second electrical contacts of the third die.

In one or more fourteenth embodiments, further to any of the eleventh through thirteenth embodiments, the packaged device further comprises an interconnect structure which extends through the first body and the second body to each of two opposite sides of the rigid mass.

In one or more fifteenth embodiments, further to any of the eleventh through fourteenth embodiments, the first die comprises a dummy die.

In one or more sixteenth embodiments, further to any of the eleventh through fourteenth embodiments, the first die comprises first back end of line (BEOL) structures, and wherein the first body and the second body each adjoin the first BEOL structures.

In one or more seventeenth embodiments, further to the sixteenth embodiment, the first BEOL structures comprise a lip structure which forms in part the first sidewall structure, and wherein the first body and the second body each adjoin the lip structure.

In one or more eighteenth embodiments, further to the sixteenth embodiment, the first BEOL structures comprise a step structure which forms in part the first sidewall structure, the first body extends to a height along the first sidewall structure which is below the step structure, and the second body adjoins the step structure.

In one or more nineteenth embodiments, further to any of the eleventh through fourteenth embodiments, the first material comprises an organic polymer, and wherein the second material comprises an inorganic compound.

In one or more twentieth embodiments, further to the nineteenth embodiment, the organic polymer comprises an epoxy resin, and wherein the inorganic compound comprises one of an oxide compound or a nitride compound.

In one or more twenty-first embodiments, a method comprises adhering to a carrier substrate multiple dies comprising a first die and a second die, and forming a rigid mass which extends around the first die and the second die, comprising depositing a first material around the first die and the second die, wherein, in a region between the first die and the second die, the first material flows by capillary action along each of a first sidewall structure of the first die, and a second sidewall structure of the second die, curing the first material to form a first body of the rigid mass, wherein a first portion of the first body forms in the region a surface structure which is concave or convex, and forming on the first body a second body of the rigid mass, the second body comprising a second material other than the first material, wherein a second portion of the second body extends across the region to each of the first sidewall structure and the second sidewall structure, wherein the second portion adjoins the surface structure.

In one or more twenty-second embodiments, further to the twenty-first embodiment, a thickness of the second body within the region is equal to or less than 20 microns.

In one or more twenty-third embodiments, further to the twenty-first embodiment or the twenty-second embodiment, the method further comprises performing a dicing operation to separate the first die, the second die, and a portion of the rigid mass from one or more others of multiple dies and from another portion of the rigid mass.

In one or more twenty-fourth embodiments, further to any of the twenty-first through twenty-third embodiments, the method further comprises forming an interconnect structure which extends through the first body and the second body to each of two opposite sides of the rigid mass.

In one or more twenty-fifth embodiments, further to any of the twenty-first through twenty-fourth embodiments, the first die comprises a dummy die.

In one or more twenty-sixth embodiments, further to any of the twenty-first through twenty-fourth embodiments, the first die comprises first back end of line (BEOL) structures, and wherein the first body and the second body each adjoin the first BEOL structures.

In one or more twenty-seventh embodiments, further to the twenty-sixth embodiment, the first BEOL structures comprise a lip structure which forms in part the first sidewall structure, and wherein the first body and the second body each adjoin the lip structure.

In one or more twenty-eighth embodiments, further to the twenty-sixth embodiment, the first BEOL structures comprise a step structure which forms in part the first sidewall structure, the first body extends to a height along the first sidewall structure which is below the step structure, and the second body adjoins the step structure.

In one or more twenty-ninth embodiments, further to any of the twenty-first through twenty-fourth embodiments, the first material comprises an organic polymer, and wherein the second material comprises an inorganic compound.

In one or more thirtieth embodiments, further to the twenty-ninth embodiment, the organic polymer comprises an epoxy resin, and wherein the inorganic compound comprises one of an oxide compound or a nitride compound.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   a first die comprising a first sidewall structure;
   a second die comprising a second sidewall structure which faces the first sidewall structure;
   a first rigid mass which extends around the first die and the second die, the first rigid mass comprising:
   a first body comprising a first material, wherein a first portion of the first body extends across a region, between the first die and the second die, to each of the first sidewall structure and the second sidewall structure, wherein the first portion forms in the region a surface structure which is concave or convex; and
   a second body of a second material other than the first material, wherein a second portion of the second body extends across the region to each of the first sidewall structure and the second sidewall structure, wherein the second portion adjoins the surface structure;
   a third die comprising a third sidewall structure;
   a fourth die comprising a fourth sidewall structure which faces the third sidewall structure; and
   a second rigid mass which extends around the third die and the fourth die, the second rigid mass comprising:
   a third body comprising a third material, wherein a third portion of the third body extends across a second region, between the third die and the fourth die, to each of the third sidewall structure and the fourth sidewall structure, wherein the third portion forms in the second region a second surface structure which is concave or convex; and
   a fourth body of a fourth material other than the third material, wherein a fourth portion of the fourth body extends across the second region to each of the third sidewall structure and the fourth sidewall structure, wherein the fourth portion adjoins the second surface structure;
   wherein first electrical contacts of the first die are electrically coupled each to a different respective one of second electrical contacts of the third die.

2. The device of claim 1, wherein a thickness of the second body within the region is equal to or less than 20 microns.

3. The device of claim 1, further comprising an interconnect structure which extends through the first body and the second body to each of two opposite sides of the first rigid mass.

4. The device of claim 1, wherein the first die comprises a dummy die.

5. The device of claim 1, wherein the first die comprises first back end of line (BEOL) structures; and
wherein the first body and the second body each adjoin the first BEOL structures.

6. The device of claim 1, wherein the first material comprises an organic polymer, and wherein the second material comprises an inorganic compound.

7. The device of claim 6, wherein the organic polymer comprises an epoxy resin, and wherein the inorganic compound comprises one of an oxide compound or a nitride compound.

8. A system comprising:
a packaged device comprising:
   a first die comprising a first sidewall structure;
   a second die comprising a second sidewall structure which faces the first sidewall structure;
   a first rigid mass which extends around the first die and the second die, the first rigid mass comprising:
      a first body comprising a first material, wherein a first portion of the first body extends across a region, between the first die and the second die, to each of the first sidewall structure and the second sidewall structure, wherein the first portion forms in the region a surface structure which is concave or convex; and
      a second body of a second material other than the first material, wherein a second portion of the second body extends across the region to each of the first sidewall structure and the second sidewall structure, wherein the second portion adjoins the surface structure;
   a third die comprising a third sidewall structure;
   a fourth die comprising a fourth sidewall structure which faces the third sidewall structure; and
   a second rigid mass which extends around the third die and the fourth die, the second rigid mass comprising:
      a third body comprising a third material, wherein a third portion of the third body extends across a second region, between the third die and the fourth die, to each of the third sidewall structure and the fourth sidewall structure, wherein the third portion forms in the second region a second surface structure which is concave or convex; and
      a fourth body of a fourth material other than the third material, wherein a fourth portion of the fourth body extends across the second region to each of the third sidewall structure and the fourth sidewall structure, wherein the fourth portion adjoins the second surface structure;
   wherein first electrical contacts of the first die are electrically coupled each to a different respective one of second electrical contacts of the third die; and
a display device coupled to the packaged device, the display device to display an image based on signals communicated with the first die or the second die.

9. The system of claim 8, further comprising an interconnect structure which extends through the first body and the second body to each of two opposite sides of the first rigid mass.

10. The system of claim 8, wherein the first die comprises a dummy die.

11. The system of claim 8, wherein the first die comprises first back end of line (BEOL) structures; and
wherein the first body and the second body each adjoin the first BEOL structures.

12. A device comprising:
a first die comprising a first sidewall structure;
a second die comprising a second sidewall structure which faces the first sidewall structure; and
a rigid mass which extends around the first die and the second die, the rigid mass comprising:
   a first body comprising a first material, wherein a first portion of the first body extends across a region, between the first die and the second die, to each of the first sidewall structure and the second sidewall structure, wherein the first portion forms in the region a surface structure which is concave or convex; and
   a second body of a second material other than the first material, wherein a second portion of the second body extends across the region to each of the first sidewall structure and the second sidewall structure, wherein the second portion adjoins the surface structure;
wherein:
   the first die comprises first back end of line (BEOL) structures;
   the first body and the second body each adjoin the first BEOL structures;
   the first BEOL structures comprise a lip structure which forms in part the first sidewall structure; and
   the first body and the second body each adjoin the lip structure.

13. A device comprising:
a first die comprising a first sidewall structure;
a second die comprising a second sidewall structure which faces the first sidewall structure; and
a rigid mass which extends around the first die and the second die, the rigid mass comprising:
   a first body comprising a first material, wherein a first portion of the first body extends across a region, between the first die and the second die, to each of the first sidewall structure and the second sidewall structure, wherein the first portion forms in the region a surface structure which is concave or convex; and
   a second body of a second material other than the first material, wherein a second portion of the second body extends across the region to each of the first sidewall structure and the second sidewall structure, wherein the second portion adjoins the surface structure;
wherein:
   the first die comprises first back end of line (BEOL) structures;
   the first body and the second body each adjoin the first BEOL structures;
   the first BEOL structures comprise a step structure which forms in part the first sidewall structure;
   the first body extends to a height along the first sidewall structure which is below the step structure; and
   the second body adjoins the step structure.

14. A system comprising:
a packaged device comprising:
- a first die comprising a first sidewall structure;
- a second die comprising a second sidewall structure which faces the first sidewall structure; and
- a rigid mass which extends around the first die and the second die, the rigid mass comprising:
  - a first body comprising a first material, wherein a first portion of the first body extends across a region, between the first die and the second die, to each of the first sidewall structure and the second sidewall structure, wherein the first portion forms in the region a surface structure which is concave or convex; and
  - a second body of a second material other than the first material, wherein a second portion of the second body extends across the region to each of the first sidewall structure and the second sidewall structure, wherein the second portion adjoins the surface structure;

wherein:
- the first die comprises first back end of line (BEOL) structures;
- the first body and the second body each adjoin the first BEOL structures;
- the first BEOL structures comprise a lip structure which forms in part the first sidewall structure; and
- the first body and the second body each adjoin the lip structure; and a display device coupled to the packaged device, the display device to display an image based on signals communicated with the first die or the second die.

* * * * *